(12) United States Patent
Deumel et al.

(10) Patent No.: US 11,573,336 B2
(45) Date of Patent: Feb. 7, 2023

(54) PEROVSKITE-BASED DETECTORS WITH INCREASED ADHESION

(71) Applicant: Siemens Healthcare GmbH, Erlangen (DE)

(72) Inventors: Sarah Deumel, Erlangen-Sieglitzhof (DE); Sandro Francesco Tedde, Weisendorf (DE); Judith Elisabeth Huerdler, Nuremberg (DE)

(73) Assignee: SIEMENS HEALTHCARE GMBH, Erlangen (DE)

( * ) Notice: Subject to any disclaimer, the term of this patent is extended or adjusted under 35 U.S.C. 154(b) by 0 days.

(21) Appl. No.: 17/159,272

(22) Filed: Jan. 27, 2021

(65) Prior Publication Data

US 2021/0239859 A1 Aug. 5, 2021

(30) Foreign Application Priority Data

Feb. 4, 2020 (EP) .................................... 20155403

(51) Int. Cl.

| | |
|---|---|
| *G01T 1/202* | (2006.01) |
| *G01T 1/16* | (2006.01) |
| *G01T 1/24* | (2006.01) |
| *H01L 27/30* | (2006.01) |
| *H01L 51/44* | (2006.01) |
| *H01L 31/0236* | (2006.01) |

(52) U.S. Cl.
CPC .......... *G01T 1/2023* (2013.01); *G01T 1/1603* (2013.01); *G01T 1/241* (2013.01); *H01L 27/308* (2013.01); *H01L 31/02366* (2013.01); *H01L 51/441* (2013.01)

(58) Field of Classification Search
CPC ........................ G01T 1/1603; H01L 31/02366
See application file for complete search history.

(56) References Cited

U.S. PATENT DOCUMENTS

| | | | |
|---|---|---|---|
| 5,132,541 A * | 7/1992 | Conrads ............ | H01L 27/14643 257/444 |
| 8,488,736 B2 | 7/2013 | Hoffman et al. | |
| 10,453,763 B2 | 10/2019 | Barber et al. | |
| 2013/0001768 A1 | 1/2013 | Nikitin | |

(Continued)

FOREIGN PATENT DOCUMENTS

| | | |
|---|---|---|
| CN | 109088003 A | 12/2018 |
| DE | 102009040627 B4 | 8/2017 |

(Continued)

OTHER PUBLICATIONS

Li et al. Methylamine Gas Based Synthesis and Healing Process Toward Upscaling of Perovskite Solar Cells: Progress and Perspective, Solar RRL vol. 1, No. 9, 1700076, 10 pages (Year: 2017).*

(Continued)

*Primary Examiner* — Blake C Riddick
(74) *Attorney, Agent, or Firm* — Harness, Dickey & Pierce, P.L.C.

(57) ABSTRACT

A detector is for electromagnetic radiation. In an embodiment, the detector includes a first, pixelated electrode layer, a second electrode, and a first layer including at least one first perovskite, located between the first, pixelated electrode layer and the second electrode. An embodiment further relates to a method for manufacturing a corresponding detector.

22 Claims, 11 Drawing Sheets

(56) References Cited

U.S. PATENT DOCUMENTS

| | | |
|---|---|---|
| 2014/0264955 A1 | 9/2014 | Feyh et al. |
| 2017/0293037 A1 | 10/2017 | Schmidt et al. |
| 2017/0322323 A1 | 11/2017 | Fischer et al. |
| 2018/0269235 A1 | 9/2018 | Kim |
| 2018/0277608 A1* | 9/2018 | Lifka .................... G01T 1/241 |
| 2018/0286923 A1 | 10/2018 | Fischer et al. |
| 2018/0294106 A1 | 10/2018 | Qi et al. |
| 2019/0074326 A1 | 3/2019 | Yu et al. |
| 2019/0123110 A1 | 4/2019 | Fischer et al. |
| 2019/0162865 A1 | 5/2019 | Huang et al. |
| 2021/0239859 A1 | 8/2021 | Deumel et al. |
| 2021/0242273 A1* | 8/2021 | Deumel ............ H01L 27/14683 |

FOREIGN PATENT DOCUMENTS

| | | |
|---|---|---|
| DE | 102016205818 A1 | 10/2017 |
| EP | 2973688 B1 | 5/2018 |
| EP | 3376260 A1 | 9/2018 |
| EP | 3379592 A1 | 9/2018 |
| EP | 3474339 A1 | 4/2019 |
| EP | 3304611 B1 | 9/2019 |
| EP | 3863059 A1 | 8/2021 |
| WO | WO 2016091442 A1 | 6/2016 |
| WO | WO 2016091600 A1 | 6/2016 |
| WO | WO-2016203724 A1 | 12/2016 |
| WO | WO 2018009712 A2 | 1/2018 |

OTHER PUBLICATIONS

Li, C. et al., "Methylamine gas based synthesis and healing process toward upscaling of perovskite solar cells: Progress and perspective", Solar RRL, 1(9), 1700076, 2017.

Kain, A. et al., "High aspect ratio- and 3D-printing of freestanding so-phisticated structures", Procedie Chemistry 1, pp. 750-753, DOI: 10.1016/j.proche.2009.07.187, 2009.

Wei, Haotong et al. "Sensitive X-ray detectors made of methylammonium lead tribromide perovskite single crystals" Nature Photonics, Mar. 2016, pp. 333-335, DOI: 10.1038/NPHOTON.2016.41.

Tokarev, V. N., et al., "High-aspect-ratio microdrilling of polymers with UV laser ablation: experiment with analytical model", Appl. Phys. A, DOI: 10.1007/s00339-002-1511-8, 2002.

Zahn, J. D. et al., "A direct plasma etch approach to high aspect ratio polymer micromachining with applications in biomems and CMOS-mems", Technical Digest. MEMS, Fifteenth IEEE International Conference on Micro Electro Mechanical Systems, DOI: 10.1109/MEMSYS.2002.984223, 2002.

Loechel, B., Thick-layer resists for surface micromachining, J. Micromech. Microeng. 10, pp. 108-115, 2000.

Del Campo, A. et al., "SU-8: a photoresist for high-aspect-ratio and 3D submicron lithography", J. Microchem. Microeng. 17, R81-R95, 2007.

Shrestha, Shreetu et al. "High-performance direct conversion X-ray detectors based on sintered hybrid lead triiodide perovskite wafers" Nature Photonics, Jun. 2017 | DOI: 10.1038/NPHOTON.2017.94.

Yakunin, Sergii et al. "Detection of X-ray photons by solution-processed orqanic-inorqanic-perovskites" Nature Photonics, May 2015; pp. 1-18; ISSN 1749-4885.

European Office Action dated Jul. 27, 2020.

Sytnyk, M., et al., "The bright future of metal halide perovskites for X-ray detection", 2019.

Sytnyk, Mykhailo et al; "A Perspective on the bright future of metal halide perovskites for X-ray detection"; Applied Physics Letters; vol. 115; No. 19; XP012241906; DOI: 10.1063; 2019.

Pacella, D., "Energy-resolved X-ray detectors: the future of diagnostic imaging", Reports in Medical Imaging, pp. 1-13, 2015.

* cited by examiner

FIG 19
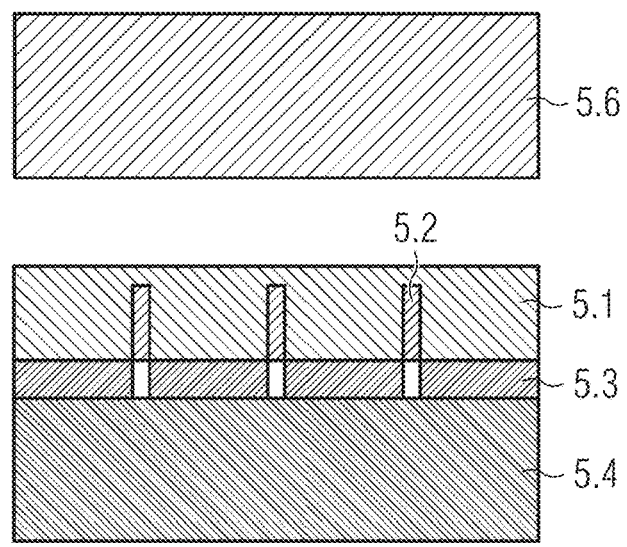
FIG 20    MA / T/ ...
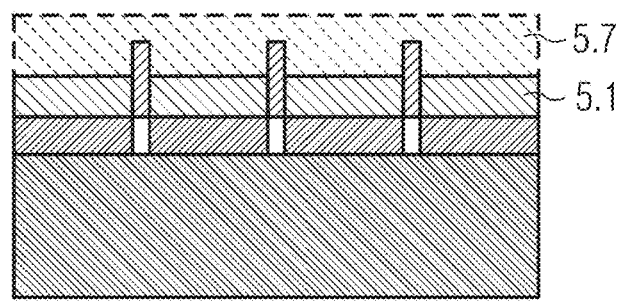
FIG 21
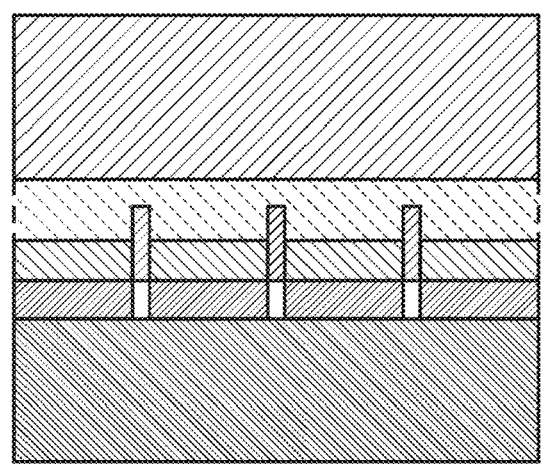

PEROVSKITE-BASED DETECTORS WITH INCREASED ADHESION

PRIORITY STATEMENT

The present application hereby claims priority under 35 U.S.C. § 119 to European patent application number EP20155403.7 filed Feb. 4, 2020, the entire contents of which are hereby incorporated herein by reference.

FIELD

An example embodiment of the application generally present invention relates to a detector for electromagnetic radiation, comprising a first, pixelated electrode layer, a second electrode, and a first layer comprising at least one first perovskite, which is located between the first pixelated electrode layer and the second electrode, as well as to a method for manufacturing a corresponding detector.

BACKGROUND

Digital X-ray detectors have a plurality of possible applications, for example in medical diagnostics, where they are usually provided in sizes between 20×20 cm² and 43×43 cm². Current detectors are based on amorphous silicon (indirect conversion) and amorphous selenium (direct conversion).

In direct conversion X-ray quantas excite a particle, which results in the formation of an electron-hole pair. After the application of an electrical field these can migrate to electrodes, where they are detected. The direct conversion of X-rays in selenium is usually carried out with precharged layers up to 1 mm thick in a blocking direction in the kV range. A direct conversion in this case, in contrast to detection using indirect converters, which can be manufactured more easily and more cheaply, usually achieves an improved resolution.

In indirect conversion X-ray quantas excite a scintillation material (e.g. CsI:Tl, with thallium doped cesium iodide; or with terbium doped gadolinium oxysulfide), which results in the formation of visible photons. These can then be made into a stacked photodetector array, which is made of amorphous silicon (a-Si) photodiodes for example, which ensures the conversion of photon to charge. After application of an electrical field these charges can be detected at photodetector electrodes.

An alternative to the two X-ray detector technologies mentioned, which are based on inorganic semiconductors, is represented by hybrid-organic detectors, which are usually manufactured from the liquid phase or from powders. These make possible simple manufacturing with sizes of 43×43 cm2 and more. Usually inorganic absorber materials such as quantum dots or scintillator particles such as gadolinium oxysulfide are introduced into the organic matrix. Organic semiconductors can be easily applied to large surfaces from the liquid phase or from powders and optical cross-talk can be minimized by direct introduction of the inorganic scintillator material. There are currently not yet any hybrid X-ray detectors on the market. Because of isotropic light emission in scintillators indirect converters usually have an inferior resolution by comparison with direct converters.

There are already many approaches to improving the adhesion and for guaranteeing electrical contacting (pixel by pixel) in a multilayer system for detectors.

Direct-converting X-ray detectors in particular are usually manufactured by growing the active material directly on the backplane, e.g. a-Se by PECVD (plasma-assisted chemical gas phase deposition) or by bump bonding of the active material to the backplane, e.g. CdTe or CZT (cadmium zinc telluride). Both methods do not have any adhesion problems, but are expensive and time-consuming. Moreover usual start materials are expensive and in the case of a crystalline material are restricted to the maximum wafer size if no butting is used.

Standardized connection techniques such as bump bonding, which are employed in the semiconductor sector, as a result of the small pixel surfaces (of in some cases below 50 µm) and the enormous number of pixels (up to 4000×4000 pixels) are not usually able to be easily transferred to other detector applications such as in X-ray detectors for example. Likewise anisotropically conducting and adhesive materials such as e.g. conductive glues or ACF (Anisotropic Conductive Film) films, which are furnished with conductive particles (e.g. silver particles), are not used because of short circuits of individual pixels, in some cases non-"connected" pixels (dead pixels) and insufficient contact surface in the pixel.

In recent times semiconducting perovskites have been mentioned as new detector materials. Semiconducting perovskites are a low-cost material for photovoltaics (PV), lasers, LED and X-ray detection, such as described for example in H. Wei et al., "Sensitive X-ray detectors made of methylammonium lead tribromide perovskite single crystals", Nature Photonics 10, 2016, pp. 333-339, doi:10.1038/nphoton.2016.41; S. Shrestha et al., "High-performance direct conversion X-ray detectors based on sintered hybrid lead triiodide perovskite wafers", Nature Photonics 11, 2017, pp. 436-440, doi:10.1038/nphoton.2017.94; and S. Yakunin et al., "Detection of X-ray photons by solution-processed lead halide perovskites", Nature Photonics 9, 2015, pp. 444-449 doi:10.1038/nphoton.2015.82. However an adhesion problem arises with these materials too.

The application of a relatively thin adhesive layer has been given as a solution for this in EP 3474339 A1. As described in EP 3474339 A1, adhesive layers can be applied, which can improve adhesion through their chemical and mechanical properties. A material already often publicized for this is Pedot:Sorbitol. However this approach has been developed for thin layers with thicknesses of a few µm or less and usually comes up against its limits with larger layers (>10 µm).

For an improved sensitivity however thick X-ray detection layers of more than 100 µm should be provided however. By application from the liquid phase or gas phase deposition however, large amounts of solvents are released, and the surface roughness can be difficult to check. A complete degasification of solvents is not only technically challenging but also problematic in respect of health and environmental aspects.

In WO 2016/091600 A1 and WO 2016/091442 A1 the manufacturing of thick detection layers comprising perovskites using a soft sinter method is proposed.

The bonding of thick perovskite layers (>100 µm) to different substrates (e.g. glass, polymer films, metal films) or functional substrates (e.g. a-Si or indium gallium zinc oxide (IGZO) backplanes for thin film transistor (TFT) arrays on glass or flexible substrates) is difficult however because of the poor adhesion of e.g. polycrystalline perovskite layers to the substrates themselves.

A further approach is the mechanical anchoring or two layers or components. EP 2973688 B1 for example deals with sensor modules which contain a shape coupling feature (trench) on a module and the matching mating piece (protruding element) on another module. The shape coupling feature specifically consists here of trenches with at least two parallel walls. Through the lock and key principle the sensor module is secured in two spatial directions against slippage. The method that is described in U.S. Pat. No. 10,453,763 B2 is based on a similar principle. This involves an encapsulation structure of an electronic device, which likewise possesses structures such as walls for example. An auxiliary material is applied in this predetermined structure and in this way increases the adhesion of the encapsulation to the substrate of the electronic device; a planar electronic contacting of individual pixels is not taken into consideration here however.

Another method for increasing the adhesion of individual components of an electronic system is the sintering of an adhesion layer: DE 102009040627 presents a method in which a structurable mask layer is applied to a semiconductor chip. The openings made by photo ablation or etching are filled with a mass with electronically conductive particles, on which a carrier layer is subsequently laid. The mass is compressed by sintering and in this way the adhesion to the carrier layer and the chip is increased.

SUMMARY

One possible approach to a solution is also the application of structured pixel electrodes by means of Physical Vapor Deposition (PVD) or Chemical Vapor Deposition (CVD) with a subsequent structuring method (e.g. photo lithography, laser deposition, etc.) directly onto the absorber layer. Standard solutions can be used here for Anisotropic Conductive Films (ACF). The inventors have discovered that this approach is not suitable for absorber layers made of perovskite however because of the chemical incompatibility of developers and solvents and the extremely long laser structuring time (also because of the high number of pixels).

The inventors further discovered that an inadequate adhesion exists between a perovskite absorber layer, for example in X-ray and/or gamma detectors, and the readout electronics of a corresponding detector, in particular with layers with a thickness of 1 µm-3000 µm). It should be noted in particular here that, in the case of a layer application, a corresponding layer promoting adhesion should be conductive or semi-conductive, but the pixels of a pixelated detector electrode should not short circuit with each other, but should only "connect" the pixels on the detection layer.

The inventors have found that a good adhesion between a layer comprising at least one first perovskite and a first, pixelated electrode can be achieved when a structure is introduced that increases the adhesion between the two. In particular the inventors have found that adhesion problems between a pixelated electrode layer and a detector layer comprising at least one perovskite (also referred to as the absorber layer) in detectors for electromagnetic radiation, in particular in pixelated X-ray and/or gamma radiation detectors/gamma detectors can be avoided by a layer comprising at least one first perovskite with a structure, which serves as the anchor structure, being connected to the pixelated electrode layer. To this end in particular, by means of liquefaction and recrystallization of perovskites in combination, a good adhesion of the at least one first perovskite or of the layer containing the latter to the structure and thus also to the pixelated electrode layer or even to a pixelated substrate can be achieved.

In a first embodiment, the invention relates to a detector for electromagnetic radiation, in particular to an X-ray and/or gamma detector, comprising:

a first, pixelated electrode layer comprising a plurality of electrode pixels as well as intermediate spaces between the individual electrode pixels, a second electrode, and a first layer comprising at least one first perovskite, which is located between the first, pixelated electrode layer and the second electrode, further comprising a structure, which is located at least partly between the first, pixelated electrode layer and the second electrode and is arranged at least partly between individual electrode pixels of the first, pixelated electrode layer in such a way that it is arranged at least partly on the intermediate spaces between the individual electrode pixels in the direction of the second electrode away from the first electrode layer, wherein the layer comprising at least one first perovskite is introduced at least partly into the structure.

Further disclosed in an embodiment is a method for manufacturing a detector for electromagnetic radiation, in particular an X-ray and/or gamma detector, comprising:

provision of a first, pixelated electrode layer comprising a plurality of electrode pixels as well as intermediate spaces between the individual electrode pixels;

application of a structure at least partly to the intermediate spaces of the first, pixelated electrode layer, wherein the structure is applied in such a way that the structure is arranged at least partly on the intermediate spaces between the individual electrode pixels away from the first electrode layer;

introduction of a first layer comprising at least one first perovskite into the structure; and application of a second electrode to the structure and/or the first layer comprising at least one first perovskite; or provision of a structure, wherein the structure has intermediate spaces;

introduction of a plurality of electrode pixels between the intermediate spaces of the structure, wherein the electrode pixels do not fill the structure, and thereby formation of a first, pixelated electrode layer;

introduction of a first layer comprising at least one first perovskite into the structure; and application of a second electrode to the structure and/or the first layer comprising at least one first perovskite.

A detector of an embodiment is for electromagnetic radiation, comprising:

a first, pixelated electrode layer including a plurality of electrode pixels, intermediate spaces existing between individual electrode pixels of the plurality of electrode pixels;

a second electrode;

a first layer including at least one first perovskite, located between the first, pixelated electrode layer and the second electrode; and a structure, located at least partly between the first, pixelated electrode layer and the second electrode and arranged at least partly between individual electrode pixels of the first, pixelated electrode layer so as to be arranged at least partly in the intermediate spaces between the individual electrode pixels in a direction of the second electrode, away from the first electrode layer, wherein the layer including the at least one first perovskite is at least partly introduced into the structure.

A method of an embodiment is for manufacturing a detector for electromagnetic radiation, comprising:

provisioning a first, pixelated electrode layer including a plurality of electrode pixels, intermediate spaces being formed between individual electrode pixels of the plurality of electrode pixels;

applying a structure at least partly to the intermediate spaces of the first, pixelated electrode layer, wherein the structure is applied such that the structure is arranged at least partly in the intermediate spaces between the individual electrode pixels, away from the first electrode layer;

introducing a first layer including at least one first perovskite, into the structure; and applying a second electrode to at least one of the structure and the first layer including at least one first perovskite, or provisioning a structure, the structure including intermediate spaces formed therein;

introducing a plurality of electrode pixels between the intermediate spaces of the structure, the plurality of electrode pixels not filling the structure, to thereby form a first, pixelated electrode layer;

introducing a first layer including at least one first perovskite, in the structure; and applying a second electrode to at least one of the structure and the first layer including at least one first perovskite.

Further embodiments of the present invention are to be taken from the claims and the more detailed description.

BRIEF DESCRIPTION OF THE DRAWINGS

The enclosed drawings are intended to illustrate forms of embodiment of the present invention and to impart a further understanding thereof. In conjunction with the description they serve to explain concepts and principles of the invention. Other forms of embodiment and many of the advantages stated are produced in respect of the drawings. The elements of the drawings are not necessarily shown to scale in relation to one another. Elements, features and components that are the same, have the same functions and work in the same way are each shown with the same reference characters in the figures of the drawings, unless stated otherwise.

Figure 12:
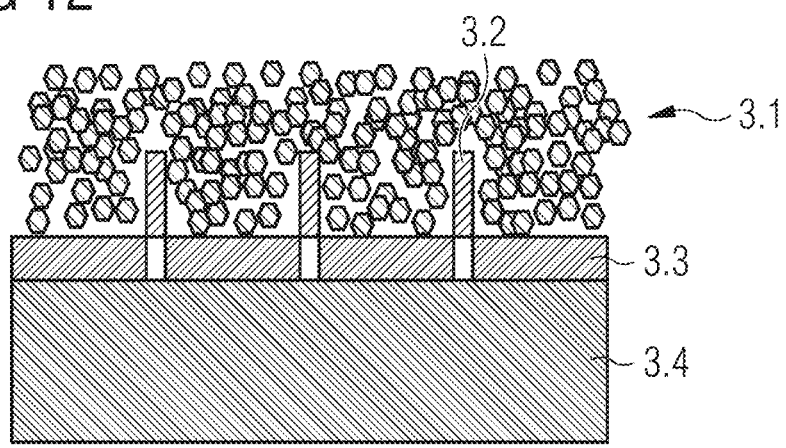
Figure 13:
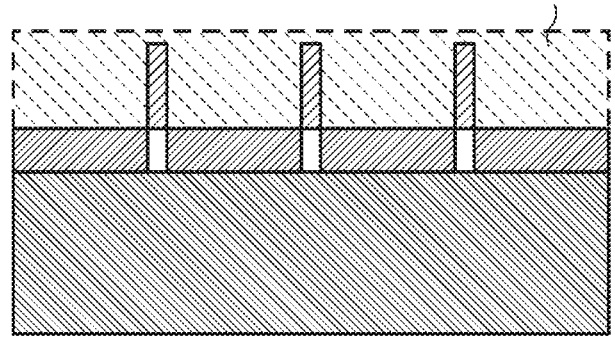
Figure 14:
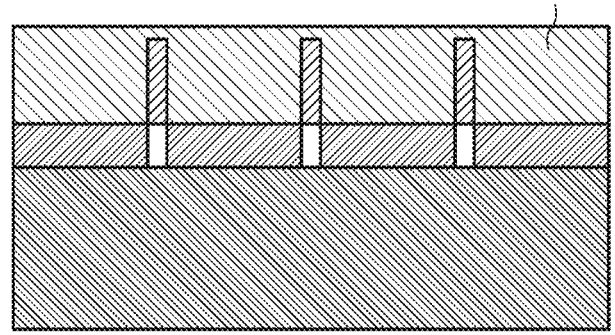

Shown in FIGS. 12 to 14 is a schematic example of a method for how a first layer can be applied.

FIGS. 15 to 18 show schematic examples of first layers in embodiments of inventive detectors.

Shown in FIGS. 19 to 22 is a schematic example of how a second layer can be applied to the first layer.

Figure 23:
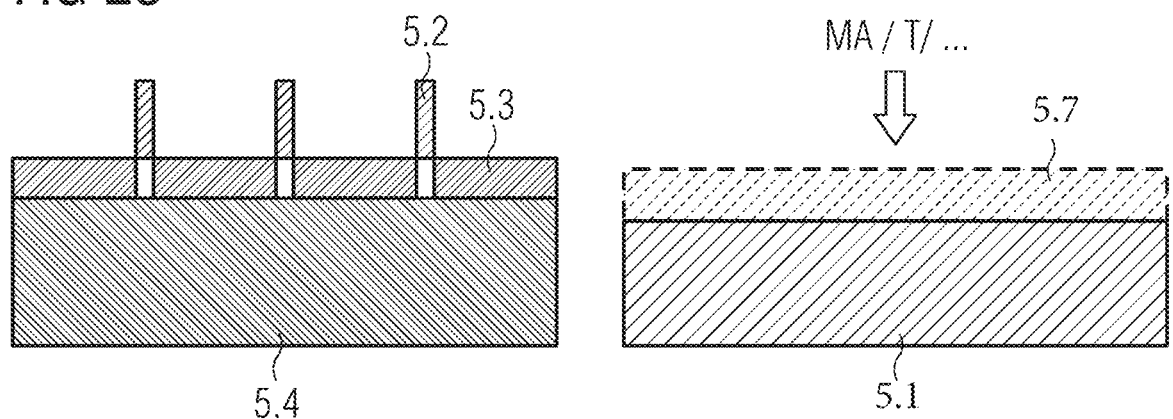
Figure 24:
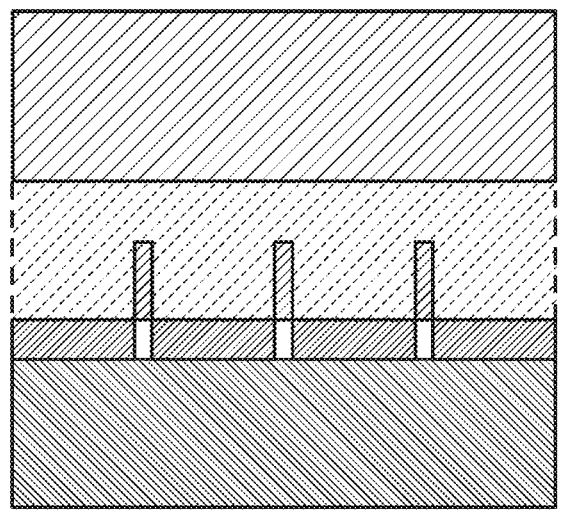
Figure 25:
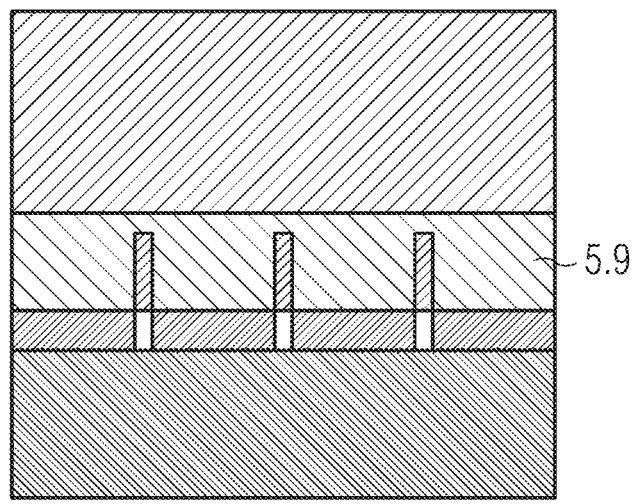

FIGS. 23 to 25 reveal by way of a schematic example how a second layer can be applied.

Figure 26:
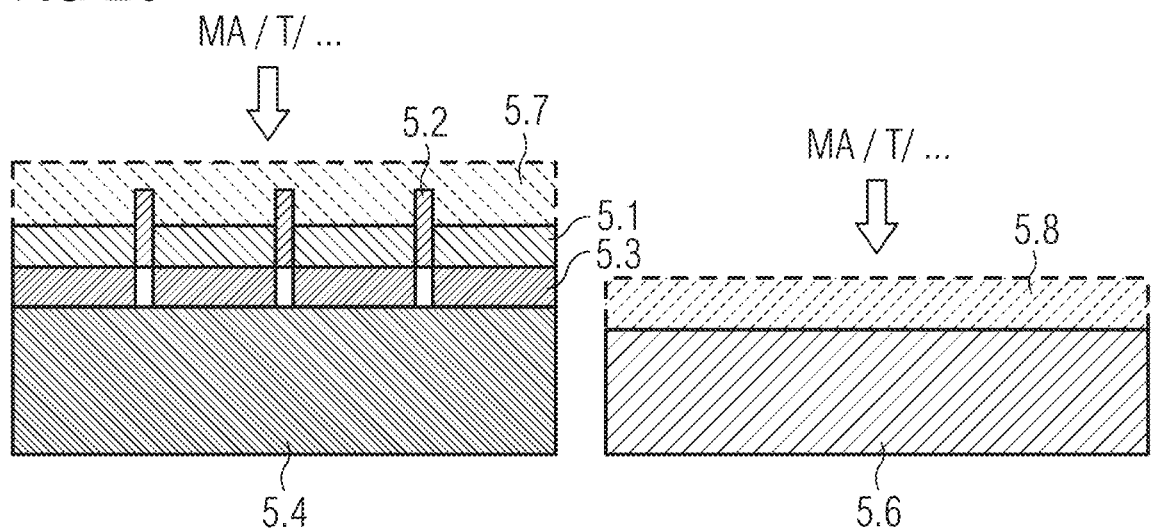
Figure 27:
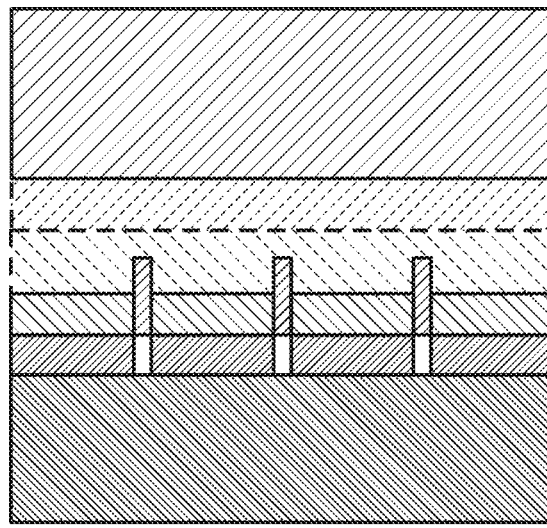
Figure 28:
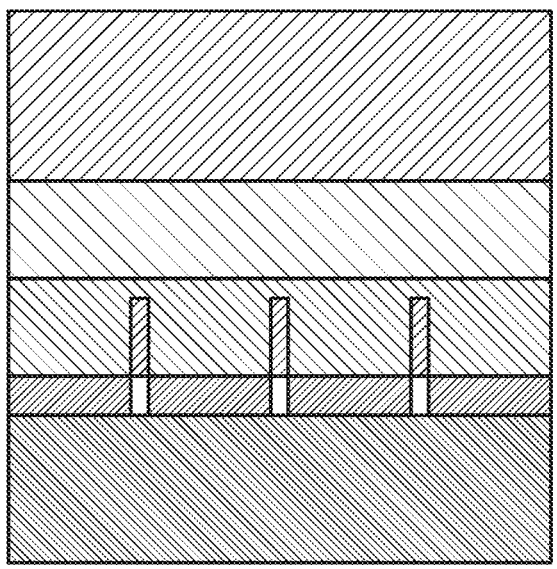

FIGS. 26 to 28 show schematically a further embodiment of an inventive method in which a first and second layer are applied.

Figure 29:
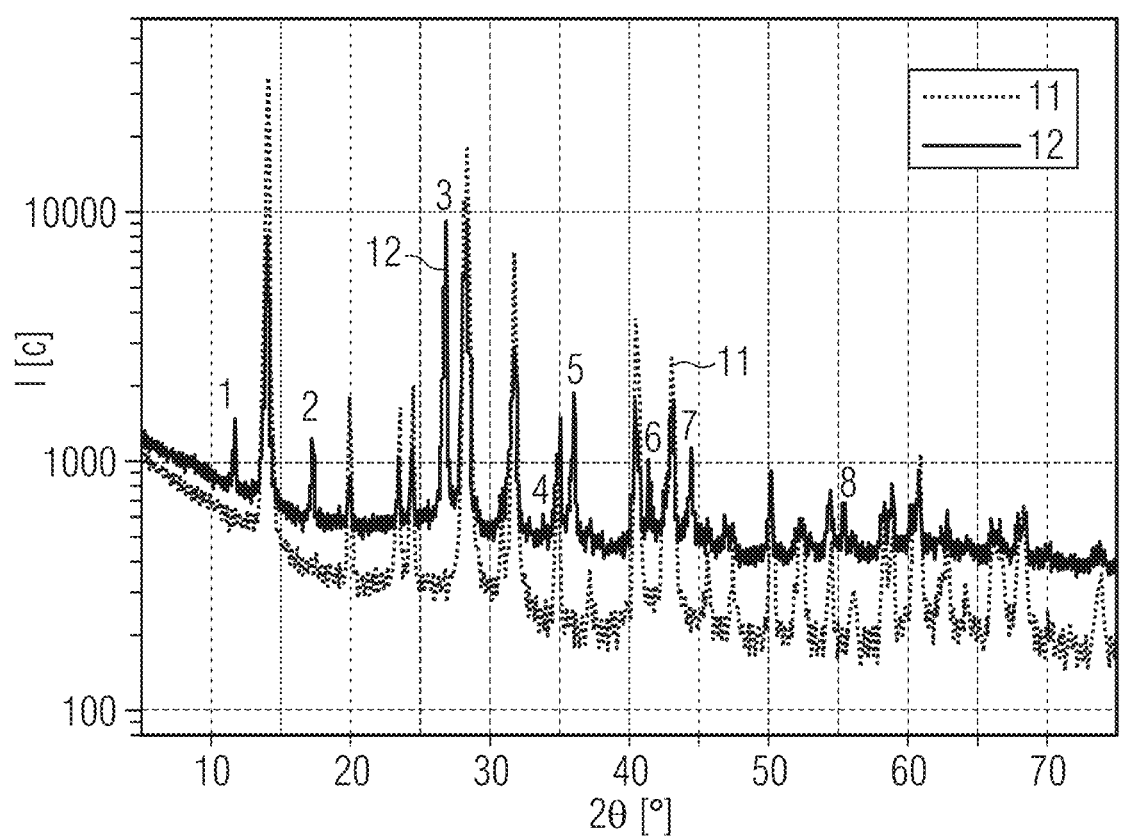

Shown in FIG. 29 is XRD data of a perovskite before and after a recrystallization.

DETAILED DESCRIPTION OF THE EXAMPLE EMBODIMENTS

The drawings are to be regarded as being schematic representations and elements illustrated in the drawings are not necessarily shown to scale. Rather, the various elements are represented such that their function and general purpose become apparent to a person skilled in the art. Any connection or coupling between functional blocks, devices, components, or other physical or functional units shown in the drawings or described herein may also be implemented by an indirect connection or coupling. A coupling between components may also be established over a wireless connection. Functional blocks may be implemented in hardware, firmware, software, or a combination thereof.

Various example embodiments will now be described more fully with reference to the accompanying drawings in which only some example embodiments are shown. Specific structural and functional details disclosed herein are merely representative for purposes of describing example embodiments. Example embodiments, however, may be embodied in various different forms, and should not be construed as being limited to only the illustrated embodiments. Rather, the illustrated embodiments are provided as examples so that this disclosure will be thorough and complete, and will fully convey the concepts of this disclosure to those skilled in the art. Accordingly, known processes, elements, and techniques, may not be described with respect to some example embodiments. Unless otherwise noted, like reference characters denote like elements throughout the attached drawings and written description, and thus descriptions will not be repeated. At least one embodiment of the present invention, however, may be embodied in many alternate forms and should not be construed as limited to only the example embodiments set forth herein.

It will be understood that, although the terms first, second, etc. may be used herein to describe various elements, components, regions, layers, and/or sections, these elements, components, regions, layers, and/or sections, should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items. The phrase "at least one of" has the same meaning as "and/or".

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below," "beneath," or "under," other elements or features would then be oriented "above" the other elements or features. Thus, the example terms "below" and "under" may encompass both an orientation of above and below. The device may be otherwise oriented (rotated 90 degrees or at other orientations) and the spatially relative descriptors used herein interpreted accordingly. In addition, when an element is referred to as being "between" two elements, the element may be the only element between the two elements, or one or more other intervening elements may be present.

Spatial and functional relationships between elements (for example, between modules) are described using various terms, including "connected," "engaged," "interfaced," and "coupled." Unless explicitly described as being "direct," when a relationship between first and second elements is described in the above disclosure, that relationship encompasses a direct relationship where no other intervening elements are present between the first and second elements, and also an indirect relationship where one or more intervening elements are present (either spatially or functionally) between the first and second elements. In contrast, when an element is referred to as being "directly" connected, engaged, interfaced, or coupled to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Also, the term "example" is intended to refer to an example or illustration.

When an element is referred to as being "on," "connected to," "coupled to," or "adjacent to," another element, the element may be directly on, connected to, coupled to, or adjacent to, the other element, or one or more other intervening elements may be present. In contrast, when an element is referred to as being "directly on," "directly connected to," "directly coupled to," or "immediately adjacent to," another element there are no intervening elements present.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Before discussing example embodiments in more detail, it is noted that some example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order. Although the flowcharts describe the operations as sequential processes, many of the operations may be performed in parallel, concurrently or simultaneously. In addition, the order of operations may be re-arranged. The processes may be terminated when their operations are completed, but may also have additional steps not included in the figure. The processes may correspond to methods, functions, procedures, subroutines, subprograms, etc.

Specific structural and functional details disclosed herein are merely representative for purposes of describing example embodiments of the present invention. This invention may, however, be embodied in many alternate forms and should not be construed as limited to only the embodiments set forth herein.

Units and/or devices according to one or more example embodiments may be implemented using hardware, software, and/or a combination thereof. For example, hardware devices may be implemented using processing circuitry such as, but not limited to, a processor, Central Processing Unit (CPU), a controller, an arithmetic logic unit (ALU), a digital signal processor, a microcomputer, a field programmable gate array (FPGA), a System-on-Chip (SoC), a programmable logic unit, a microprocessor, or any other device capable of responding to and executing instructions in a defined manner. Portions of the example embodiments and corresponding detailed description may be presented in terms of software, or algorithms and symbolic representations of operation on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" of "displaying" or the like, refer to the action and processes of a computer system, or similar electronic computing device/hardware, that manipulates and transforms data represented as physical, electronic quantities within the computer system's registers and memories into other data similarly represented as physical quantities within the computer system memories or registers or other such information storage, transmission or display devices.

In this application, including the definitions below, the term 'module' or the term 'controller' may be replaced with the term 'circuit.' The term 'module' may refer to, be part of, or include processor hardware (shared, dedicated, or group) that executes code and memory hardware (shared, dedicated, or group) that stores code executed by the processor hardware.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

Software may include a computer program, program code, instructions, or some combination thereof, for independently or collectively instructing or configuring a hardware device to operate as desired. The computer program and/or program code may include program or computer-readable instructions, software components, software modules, data files, data structures, and/or the like, capable of being implemented by one or more hardware devices, such as one or more of the hardware devices mentioned above. Examples of program code include both machine code produced by a compiler and higher level program code that is executed using an interpreter.

For example, when a hardware device is a computer processing device (e.g., a processor, Central Processing Unit (CPU), a controller, an arithmetic logic unit (ALU), a digital signal processor, a microcomputer, a microprocessor, etc.), the computer processing device may be configured to carry out program code by performing arithmetical, logical, and input/output operations, according to the program code. Once the program code is loaded into a computer processing device, the computer processing device may be programmed to perform the program code, thereby transforming the computer processing device into a special purpose computer processing device. In a more specific example, when the program code is loaded into a processor, the processor becomes programmed to perform the program code and operations corresponding thereto, thereby transforming the processor into a special purpose processor.

Software and/or data may be embodied permanently or temporarily in any type of machine, component, physical or virtual equipment, or computer storage medium or device, capable of providing instructions or data to, or being interpreted by, a hardware device. The software also may be distributed over network coupled computer systems so that the software is stored and executed in a distributed fashion. In particular, for example, software and data may be stored by one or more computer readable recording mediums, including the tangible or non-transitory computer-readable storage media discussed herein.

Even further, any of the disclosed methods may be embodied in the form of a program or software. The program or software may be stored on a non-transitory computer readable medium and is adapted to perform any one of the aforementioned methods when run on a computer device (a device including a processor). Thus, the non-transitory, tangible computer readable medium, is adapted to store information and is adapted to interact with a data processing facility or computer device to execute the program of any of the above mentioned embodiments and/or to perform the method of any of the above mentioned embodiments.

Example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order.

According to one or more example embodiments, computer processing devices may be described as including various functional units that perform various operations and/or functions to increase the clarity of the description. However, computer processing devices are not intended to be limited to these functional units. For example, in one or more example embodiments, the various operations and/or functions of the functional units may be performed by other ones of the functional units. Further, the computer processing devices may perform the operations and/or functions of the various functional units without sub-dividing the operations and/or functions of the computer processing units into these various functional units.

Units and/or devices according to one or more example embodiments may also include one or more storage devices. The one or more storage devices may be tangible or non-transitory computer-readable storage media, such as random access memory (RAM), read only memory (ROM), a permanent mass storage device (such as a disk drive), solid state (e.g., NAND flash) device, and/or any other like data storage mechanism capable of storing and recording data. The one or more storage devices may be configured to store computer programs, program code, instructions, or some combination thereof, for one or more operating systems and/or for implementing the example embodiments described herein. The computer programs, program code, instructions, or some combination thereof, may also be loaded from a separate computer readable storage medium into the one or more storage devices and/or one or more computer processing devices using a drive mechanism. Such separate computer readable storage medium may include a Universal Serial Bus (USB) flash drive, a memory stick, a Blu-ray/DVD/CD-ROM drive, a memory card, and/or other like computer readable storage media. The computer programs, program code, instructions, or some combination thereof, may be loaded into the one or more storage devices and/or the one or more computer processing devices from a remote data storage device via a network interface, rather than via a local computer readable storage medium. Additionally, the computer programs, program code, instructions, or some combination thereof, may be loaded into the one or more storage devices and/or the one or more processors from a remote computing system that is configured to transfer and/or distribute the computer programs, program code, instructions, or some combination thereof, over a network. The remote computing system may transfer and/or distribute the computer programs, program code, instructions, or some combination thereof, via a wired interface, an air interface, and/or any other like medium.

The one or more hardware devices, the one or more storage devices, and/or the computer programs, program code, instructions, or some combination thereof, may be specially designed and constructed for the purposes of the example embodiments, or they may be known devices that are altered and/or modified for the purposes of example embodiments.

A hardware device, such as a computer processing device, may run an operating system (OS) and one or more software applications that run on the OS. The computer processing device also may access, store, manipulate, process, and create data in response to execution of the software. For simplicity, one or more example embodiments may be exemplified as a computer processing device or processor; however, one skilled in the art will appreciate that a hardware device may include multiple processing elements or processors and multiple types of processing elements or processors. For example, a hardware device may include multiple processors or a processor and a controller. In addition, other processing configurations are possible, such as parallel processors.

The computer programs include processor-executable instructions that are stored on at least one non-transitory computer-readable medium (memory). The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc. As such, the one or more processors may be configured to execute the processor executable instructions.

The computer programs may include: (i) descriptive text to be parsed, such as HTML (hypertext markup language) or XML (extensible markup language), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Haskell, Go, SQL, R, Lisp, Java®, Fortran, Perl, Pascal, Curl, OCaml, Javascript®, HTML5, Ada, ASP (active server pages), PHP, Scala, Eiffel, Smalltalk, Erlang, Ruby, Flash®, Visual Basic®, Lua, and Python®.

Further, at least one embodiment of the invention relates to the non-transitory computer-readable storage medium including electronically readable control information (procesor executable instructions) stored thereon, configured in such that when the storage medium is used in a controller of a device, at least one embodiment of the method may be carried out.

The computer readable medium or storage medium may be a built-in medium installed inside a computer device main body or a removable medium arranged so that it can be separated from the computer device main body. The term computer-readable medium, as used herein, does not encompass transitory electrical or electromagnetic signals propagating through a medium (such as on a carrier wave); the term computer-readable medium is therefore considered tangible and non-transitory. Non-limiting examples of the non-transitory computer-readable medium include, but are not limited to, rewriteable non-volatile memory devices (including, for example flash memory devices, erasable programmable read-only memory devices, or a mask read-only memory devices); volatile memory devices (including, for example static random access memory devices or a dynamic random access memory devices); magnetic storage media (including, for example an analog or digital magnetic tape or a hard disk drive); and optical storage media (including, for example a CD, a DVD, or a Blu-ray Disc). Examples of the media with a built-in rewriteable non-volatile memory, include but are not limited to memory cards; and media with a built-in ROM, including but not limited to ROM cassettes; etc. Furthermore, various information regarding stored images, for example, property information, may be stored in any other form, or it may be provided in other ways.

The term code, as used above, may include software, firmware, and/or microcode, and may refer to programs, routines, functions, classes, data structures, and/or objects. Shared processor hardware encompasses a single microprocessor that executes some or all code from multiple modules. Group processor hardware encompasses a microprocessor that, in combination with additional microprocessors, executes some or all code from one or more modules. References to multiple microprocessors encompass multiple microprocessors on discrete dies, multiple microprocessors on a single die, multiple cores of a single microprocessor, multiple threads of a single microprocessor, or a combination of the above.

Shared memory hardware encompasses a single memory device that stores some or all code from multiple modules. Group memory hardware encompasses a memory device that, in combination with other memory devices, stores some or all code from one or more modules.

The term memory hardware is a subset of the term computer-readable medium. The term computer-readable medium, as used herein, does not encompass transitory electrical or electromagnetic signals propagating through a medium (such as on a carrier wave); the term computer-readable medium is therefore considered tangible and non-transitory. Non-limiting examples of the non-transitory computer-readable medium include, but are not limited to, rewriteable non-volatile memory devices (including, for example flash memory devices, erasable programmable read-only memory devices, or a mask read-only memory devices); volatile memory devices (including, for example static random access memory devices or a dynamic random access memory devices); magnetic storage media (including, for example an analog or digital magnetic tape or a hard disk drive); and optical storage media (including, for example a CD, a DVD, or a Blu-ray Disc). Examples of the media with a built-in rewriteable non-volatile memory, include but are not limited to memory cards; and media with a built-in ROM, including but not limited to ROM cassettes; etc. Furthermore, various information regarding stored images, for example, property information, may be stored in any other form, or it may be provided in other ways.

The apparatuses and methods described in this application may be partially or fully implemented by a special purpose computer created by configuring a general purpose computer to execute one or more particular functions embodied in computer programs. The functional blocks and flowchart elements described above serve as software specifications, which can be translated into the computer programs by the routine work of a skilled technician or programmer.

Although described with reference to specific examples and drawings, modifications, additions and substitutions of example embodiments may be variously made according to the description by those of ordinary skill in the art. For example, the described techniques may be performed in an order different with that of the methods described, and/or components such as the described system, architecture, devices, circuit, and the like, may be connected or combined to be different from the above-described methods, or results may be appropriately achieved by other components or equivalents.

Unless defined otherwise, technical and scientific expressions used herein have the same meaning as is generally understood by a person skilled in the art in the specialist field of the invention.

Amounts specified relate within the context of the present invention to percent by weight, unless otherwise specified or evident from the context.

A first embodiment of the present invention relates to a detector for electromagnetic radiation, in particular to an X-ray and/or gamma detector, comprising:

a first, pixelated electrode layer comprising a plurality of electrode pixels as well as intermediate spaces between the individual electrode pixels, a second electrode, and a first layer comprising at least one first perovskite, which is located between the first, pixelated electrode layer and the second electrode, further comprising a structure, which is located at least partly between the first, pixelated electrode layer and the second electrode and is arranged at least partly between individual electrode pixels of the first, pixelated electrode layer in such a way that it is arranged at least partly on the intermediate spaces between the individual electrode pixels in the direction of the second electrode away from the first electrode layer, wherein the layer comprising at least one first perovskite is introduced at least partly into the structure.

The first layer comprising at least one first perovskite being introduced into the structure means here in particular that the first layer is introduced in an area that extends between the structure above the electrode pixels. Although with an at least partly porous structure with porous material, which would theoretically be possible here, an introduction of the layer within the structure material is also possible (which is not excluded here), what is meant in particular by the introduction is that the first layer comprising the at least one first perovskite is introduced into area that are defined by the structure and lie between parts of the structure, such as walls, in a grid etc.

In an embodiment of the inventive detector the first, pixelated electrode layer is not especially restricted. The first, pixelated electrode layer here has a plurality (i.e. 2 or more, for example 3, 4, 5, 6, 7, 8, 9, 10, 100, 1000 or more) of electrode pixels or pixels, which can be electrically contacted. Neither the pixel size nor the material of the electrode pixels are especially restricted, and electrode pixels can be used that have already been used previously in detectors for electromagnetic radiation, in particular X-ray and/or gamma detectors. An electrode pixel with a pitch of 98 μm of a quadratic electrode pixel can be used as the electrode pixel for example, which defines an electrode pixel, wherein other pixel sizes are also possible. The material of the electrode pixel is not especially restricted and can comprise a conductive metal oxide, a conductive polymer, and/or a metal, which serves to detect an electron and/or hole that is created by a perovskite. Where a substrate is present, a substrate can be a pixelated substrate, on which the electrode pixel of the first, pixelated electrode layer are located.

The first, pixelated electrode layer comprises a plurality of electrode pixels as well as intermediate spaces between the electrode pixel or pixel, which can form a grid structure. The intermediate spaces or the grid structure here can comprise a non-conductive material, which is not especially restricted and can for example also be a material of a substrate, for example when electrode pixels are introduced after material removal in a substrate (e.g. by etching, etc.) and introduction of the electrode pixels into a substrate, and/or also the electrode pixels of the first electrode layer are insulated from one another in some other way, for example by a gas such as air etc., for example when the electrode pixels are applied to a substrate.

In an embodiment of the inventive detector the first, pixelated electrode layer (and also the second electrode and/or the first layer as well as where necessary further layers and/or the substrate, etc.) can be flat and/or curved, so that flat or also curved detectors can be produced.

What is more the second electrode is also not especially restricted. In accordance with specific forms of embodiment the second electrode comprises a conductive metal oxide, a conductive polymer, and/or a metal. In the inventive detector the first and second electrode (or the first electrode layer and the second electrode) can be suitably connected as anode and/or cathode. In accordance with specific forms of embodiment the second electrode is embodied flat. In accordance with specific forms of embodiment the second electrode is at least partly transparent or completely transparent for electromagnetic radiation to be detected, which is not especially restricted and for example can be X-ray (wavelength≥10 μm and <10 nm) and/or gamma radiation (wavelength<10 μm). For example the second electrode can comprise indium tin oxide (ITO), aluminum doped zinc oxide (AZO), antimony tin oxide (ATO) and/or fluorine tin oxide (FTO) or can consist thereof.

The structure is likewise not especially restricted, provided it is arranged at least partly or completely between individual pixels of the first, pixelated electrode layer. To this end the structure can also be located partly on electrode pixels of the first, pixelated electrode layer, provided it lies at least partly between two electrode pixels of the first, pixelated electrode layer, i.e. for example in such a way that it is arranged in intermediate spaces or in a grid structure of the first, pixelated electrode layer (formed for example from a non-electrode material of the first, pixelated electrode layer and/or a gas such as air), directly on intermediate spaces or the grid structure or the material of the intermediate spaces or grid structure between electrode pixels, and/or over intermediate spaces, i.e. likewise on the material of the intermediate spaces between electrode pixels, for example of the grid structure or its material. To this end the structure is arranged in such a way that it extends at least away from the first, pixelated electrode layer in the direction of the second electrode, i.e. forms a three-dimensional structure, which is located at least between the first, pixelated electrode layer and the second electrode. It is not excluded here for parts of the structure also to be located within the first, pixelated electrode layer, for example in the intermediate spaces, in order to make sure of a better anchoring of the structure. The structure forms an anchor structure for at least parts of the first layer, whereby the first layer can be better connected to the first, pixelated electrode layer. Through the structure, which in particular is applied as an electrically insulating structure, an increase in the anchorage surface for the first layer on the first, pixelated electrode layer and where necessary also on a substrate is made possible.

The structure is thus located in accordance with specific forms of embodiment at least partly or also completely in an area that is defined by the intermediate spaces or the grid structure of the first, pixelated electrode layer between individual electrode pixels, wherein the structure can also lie in the intermediate spaces or the grid structure. It is not excluded here for the structure also to lie partly on and/or above the electrode pixels of the first, pixelated electrode layer. The structure is located between the electrode pixels in such a way that, at least above the intermediate spaces of the first, pixelated electrode layer in the direction the second electrode, a 3D shape is formed or a three-dimensional body is formed. The shape of such a body of the structure is not especially restricted.

Figure 2:
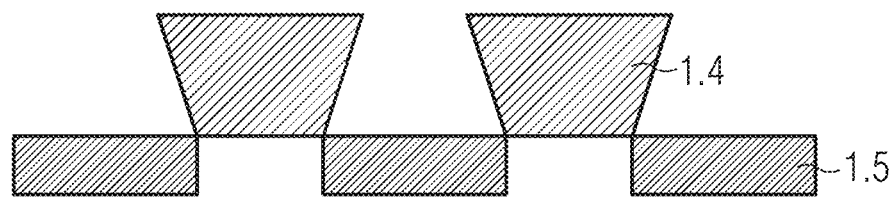
FIGS. 2 to 11 show schematics of different examples of structures, which can be used in inventive detectors.
Figure 3:
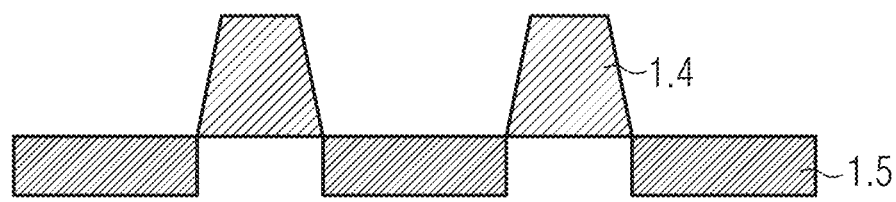
Figure 4:
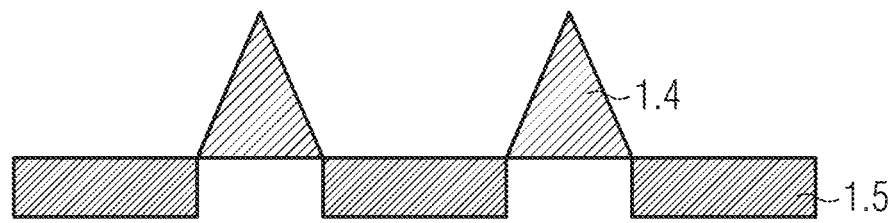
Figure 5:
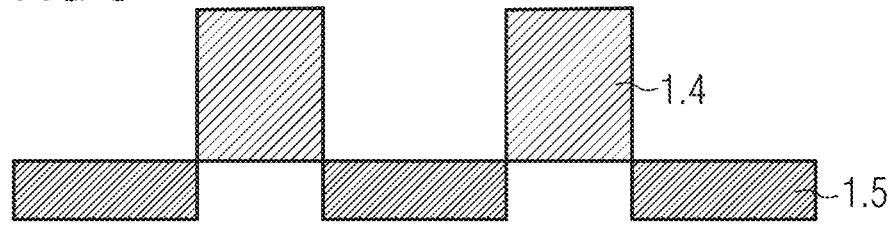
Figure 6:
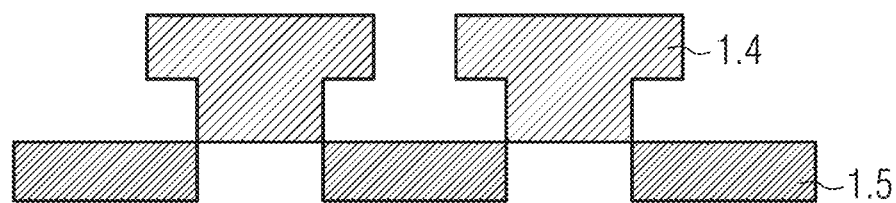

Examples of shapes for the structure are shown schematically in the form of two-dimensional sections in FIGS. 2 to 11. These figures also plainly show how the structure 1.4 is arranged at least partly between the electrode pixels 1.5. In FIGS. 2 and 3 structures are shown for example, which widen out or narrow down to second electrodes (not shown, located above them). Such shapes are able to be obtained for example by the use of different photoresists (negative or positive photoresists) during manufacturing. The shapes shown in FIGS. 4 to 6 are also able to be obtained for example by using different photoresists, and/or by other methods explained below. The shape shown in FIG. 6 can be manufactured for example by means of a lift-off resist (LOR).

Figure 7:
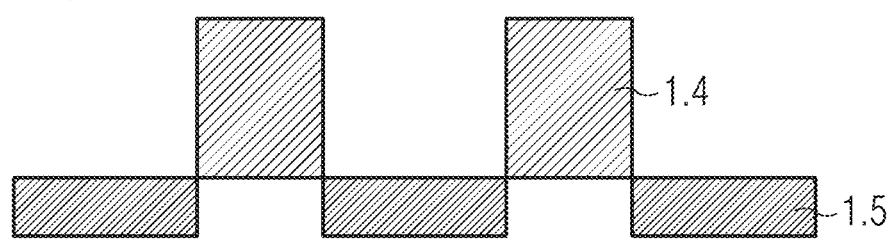
Figure 8:
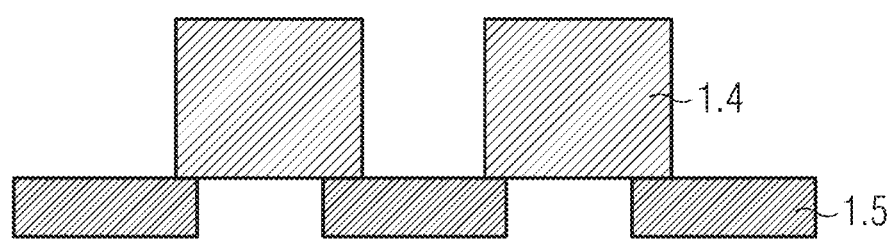
Figure 9:
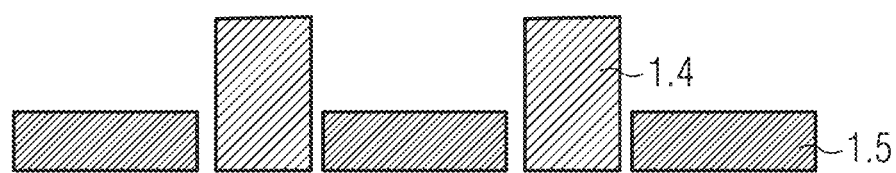
Figure 10:
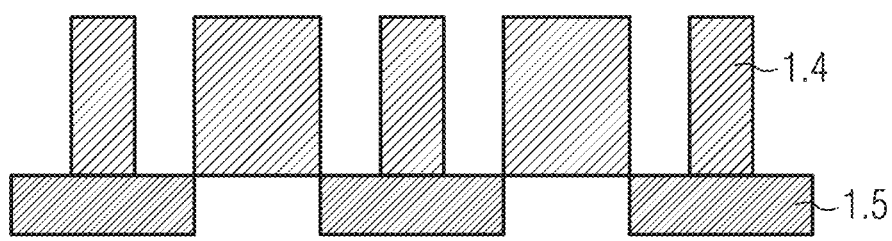
Figure 11:
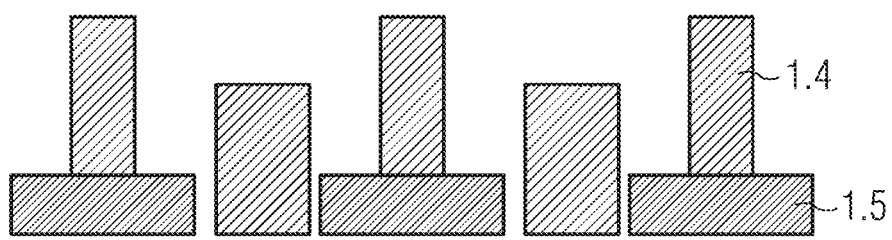

As well as their different shapes the dimensions of the structure 1.4 can also vary, as can be seen in FIGS. 7 to 9: One example would be that the structures 1.4 fit precisely between the electrode pixels 1.5 (FIG. 7); in another example the structure 1.4 is wider than the gap between the electrode pixels 1.5, i.e. the intermediate space (FIG. 8); alternatively the structure 1.4 can also be narrower than the gap between the electrode pixels 1.5, wherein here the structure 1.4 can also be introduced into the intermediate spaces (which is also not excluded in the other Figures; FIG. 9). Furthermore parts of the structure 1.4 can also be extended in addition above the active surface of the electrode pixels 1.5, as is shown schematically in FIGS. 10 and 11. This enables the adhesion of the first layer to be further strengthened, however the detection can likewise be reduced by the reduction of the active surface of the electrode pixels 1.5 available for detection.

The various shapes of the structure are also able to be obtained in other ways as well, for example by selective etching and/or laser ablation of a substrate with subsequent introduction of the electrode pixels into etched and/or removed areas of the substrate, wherein here the material of the intermediate spaces of the first, pixelated electrode layer and of the structure can correspond to the material of the substrate, and/or by 3D printing. In such cases various polymers, ceramics etc. are possible for example as material of the structure. Corresponding methods for selective etchings are known for example from J. D. Zahn et al., "A direct plasma etch approach to high aspect ratio polymer micromachining with applications in biomems and CMOS-mems", Technical Digest. MEMS 2002 IEEE International Conference, the entire contents of which are hereby incorporated therein by reference. Fifteenth IEEE International Conference on Micro Electro Mechanical Systems, DOI: 10.1109/MEMSYS.2002.984223, the entire contents of which are hereby incorporated therein by reference. An example of a method for laser ablation is described for example in V. N. Tokarev et al., "High-aspect-ratio microdrilling of polymers with UV laser ablation:experiment with analytical model", Appl. Phys. A, 2002, DOI: 10.1007/s00339-002-1511-8, the entire contents of which are hereby incorporated therein by reference. A method for 3D printing is known for example from A. Kain et al., "High aspect ratio-and 3D-printing of freestanding sophisticated structures", Procedie Chemistry 1, 2009, 750-753, DOI: 10.1016/j.proche.2009.07.187, the entire contents of which are hereby incorporated therein by reference.

The dimensions of the structure are also not especially restricted. However a structure is preferred, which from the surface of the first, pixelated electrode layer, has a height of 0.5 to 1500 µm, preferably 1 to 1000 µm, further preferably 2 to 500 µm, further preferably 3 to 300 µm, even further preferably 5 to 100 µm, even further preferably 7 to 70 µm, in particular 10 to 50 µm. Also a structure with a high aspect ratio (ratio of height to width) is preferred, in particular when the structure extends as a "grid" and/or "wall" away from the surface of the first, pixelated electrode layer, wherein here a width of the wall and/or of the cross members of the grid for example can amount to 0.5 to 80 µm, preferably 1 to 50 µm, further preferably 2 to 35 µm, even further preferably 3 to 25 µm, even further preferably 4 to 15 µm, in particular 5 to 10 µm, wherein the width can be measured for example directly on the surface of the first, pixelated electrode layer, in particular with narrowing or widening structures shaped irregularly in any other way.

It is also not excluded for the structure to be filled with the electrode pixels in the structure during manufacturing, i.e. only after the structure is created. Here if necessary high aspect ratios can also be achieved.

Where the structure also lies in the intermediate space, the electrode pixels are almost located in the structure, so that here the first, pixelated electrode layer can also be formed by parts of the structure, in the area of the intermediate spaces of the first, pixelated electrode layer (the first, pixelated electrode layer would then be understood here as a layer of the same height as the height of the electrode pixels, which is theoretically taken from the detector, wherein then the material of the structure is located between the electrode pixels and thus fills the intermediate spaces between the electrode pixels). The intermediate spaces then have a height, as also in the first, pixelated electrode layer, which corresponds to the height of the electrode pixels (also referred to as pixel electrodes). The electrode pixels here can have a fill factor of the structure (i.e. the areas of the structure not filled by the material of the structure) of for example up to 90%, preferably however <50%, preferably <10%, more preferably <2%.

A size or a pitch of an electrode pixel of 150 µm or more, a width of the structure of 50 µm and less and/or a height of the structure of up to 1250 µm is possible.

The material of the structure is likewise not especially restricted, but is preferably electrically insulating however in order to avoid a short circuit between individual electrode pixels. The material of the structure here can also depend on the manufacture of the structure itself. As described above, the material of the structure can also correspond to the material of the intermediate spaces and possibly also to that of a substrate, but it can also be different, for example with an application of material such as with 3D printing or the application of resists.

In this way for example a typical manufacturing of the structure by the application of resists, for example photoresists, is possible, which can be suitably structured by shaping and/or masking and where necessary can also be applied a number of times. The resists, for example photoresists, are not especially restricted. A suitable choice of the resist, for example photoresist, also enables an adhesion of the first layer and in particular of the at least one first perovskite to the structure to be influenced. This also includes a wetting behavior of the material of the first layer and in particular of the at least one first perovskite, if this is a least partly liquefied in an inventive method for recrystallization. The same also applies for other materials in other manufacturing methods, as mentioned above.

The different photoresists are not especially restricted and can for example be both positive and negative or can be other structurable materials. Examples of positive photoresists or photoresists are e.g. AZ 10XT, AZ 12XT, AZ 40XT, AZ 4533, AZ 4562, AZ 9245, AZ 9260, AS IPS 6050, AZ P4110, AZ P4260, AZ P4903 and PL 177 made by Microchemicals GmbH, and examples of negative photoresists are e.g. AZ 125nXT, AZ 125 nXT (115CPS), AZ 15nXT (450CPS), AZ nLof 2020, AZ nLof 2035, AZ nLof 2070 and AZ nLof 5510 made by Microchemicals GmbH. Further examples of photoresists as well as methods for their structuring are given in B. Loechel, "Thick-layer resists for surface micromachining", J. Micromech. Microeng, the entire contents of which are hereby incorporated therein by reference. 10, 2000, 108-115. SU-8 should be mentioned as a further example of photoresist, described for example in A. del Campo and C. Greiner, "SU-8: a photoresist for high-aspect-ratio and 3D submicron lithography", J. Microchem. Microeng. 17, 2007, R81-R95, the entire contents of which are hereby incorporated therein by reference.

The first layer comprising at least one first perovskite is likewise not especially restricted. The amount of first perovskite in the first layer is also not especially restricted. In accordance with specific forms of embodiment the first layer comprises the at least one first perovskite in an amount of ≥30% w/w, ≥50% w/w, or ≥70% w/w, relative to the first layer, or essentially consists of the first perovskite (e.g. ≥90% w/w, ≥95% w/w, or ≥99% w/w, relative to the first layer); or even consists of the at least one first perovskite.

In the first layer the at least one first perovskite is not especially restricted, and it can comprise one perovskite or a plurality of perovskites, for example 2, 3, 4, 5 or more perovskites. In accordance with specific forms of embodiment the first layer comprises one perovskite.

The first perovskite is not especially restricted. For example both organic-inorganic and also purely inorganic perovskites with an $ABX_3$-structure, with one or more cations ($A^+$), one or more $B^+$ cations and one or more halides $X^-$ can be used, which are not especially restricted. Examples of suitable perovskites as first perovskite in accordance with specific forms of embodiment are $MAPbI_3$ ($CH_3NH_3PbI_3$), $MAPbBr_3$ ($CH_3NH_3PbBr_3$), $FAPbI_3$ ($HC(NH_2)_2PbI_3$), $MAPbICl_2$ ($CH_3NH_3PbICl_2$), $FAPbBr_3$ ($HC(NH_2)_2PbBr_3$), $EAPbI_3$ ($CH_3CH_2NH_3PbI_3$), $PAPbI_3$ ($CH_3CH_2CH_2NH_3PbI_3$), $BA_2PbI_4$ (($CH_3CH_2CH_2NH_3)_2PbI_4$), $PMA_2PbI_4$ (($C_6H_5CH_2NH_3)_2PbI_4$), $PEA_2PbI_4$ (($C_6H_5CH_2CH_2NH_3)_2PbI_4$), $EAPbBr_3$ ($CH_3CH_2NH_3PbBr_3$), $PAPbBr_3$ ($CH_3CH_2CH_2NH_3PbBr_3$); mixed halides of the same; inorganic-organic perovskites with a mixture of A cations with halides X (X=Cl, I, and/or Br), such as for example $MAFAPbX_3$ ($MA=CH_3NH_3$, $FA=HC(NH_2)_2$), $MAGAPbX_3$ (GA=guanidinium), $BAPAPbX_3$ ($BA=CH_3CH_2CH_2CH_2NH_3$, $PA=CH_3CH_2CH_2NH_3$); organic halogenated mixtures, in which the halogens are partly replaced by other halogens (e.g. with halides of the formula $I_3$-xClx or Br3-xClx, etc., e.g. $MAPbI_3$-xClx or $CH_3NH_3PbBr_3$-xClx); organic and/or organic-inorganic perovskites, in which Pb is substituted at least partly or even completely by Sn, Cu, Ni, Bi, Co, Fe, Mn, Cr, Cd, Ge and/or Yb, and/or mixtures thereof; inorganic perovskites and mixtures thereof, for example $CsPbX_3$, wherein X=Cl, Br, and/or I, as well as mixtures thereof, $Cs_3Bi_2X_9$, wherein X=Cl, Br, and/or I, as well as mixtures thereof, $Cs_3Sb_2X$, wherein X=Cl, Br, and/or I, as well as mixtures thereof, $Cs_2AgBiX_6$, wherein X=Cl, Br, and/or I, as well as mixtures thereof, $Rb_3Bi_2X_9$, wherein X=Cl, Br, and/or I, as well as mixtures thereof, $Rb_3Sb_2X_9$, wherein X=Cl, Br, and/or I, as well as mixtures thereof, $CsSnI_3$; etc., as well as mixtures of the perovskites.

The layer thickness of the first layer is not especially restricted and can be less than or greater than the height of the structure, to which and in which the first layer is applied and introduced. So that the layer thickness is less than the height of the structure, the first layer is completely introduced into the structure and individual parts of the first layer are separated from one another by the structure. The first layer can for example have a thickness of 0.5 to 1500 μm, preferably 1 to 1000 μm, further preferably 3 to 300 μm, even further preferably 4 to 200 μm, in particular 5 to 100 μm, further preferably 7 to 70 μm, even more preferably 10 to 50 μm.

The first layer serves, in accordance with specific forms of embodiment, for physical contacting between the first and second electrode, where necessary with further layers, as well as where necessary also as a detector layer, in which electron-hole pairs are created, so that for example no further detector layer is present. To this end it is also introduced into the structure. Through the structure an improved adhesion of the first layer comprising at least one first perovskite and in particular of the first perovskite to the first, pixelated electrode or where necessary further layers is made possible.

The first layer comprising the at least one first perovskite is at least partly introduced into the structure. In particular, in accordance with specific forms of embodiment it contacts the electrode pixels of the first, pixelated electrode layer, or a layer further introduced where necessary, which in this way can create an indirect contact to the first, pixelated electrode layer.

The introduction of the first layer into the structure is not especially restricted, and it can be introduced in such a way that it only partly fills the structure, it can be introduced in such a way that if fills the structure exactly, i.e. is flush with an upper edge or an uppermost point of the structure, or it can be introduced in such a way that it extends beyond the structure, i.e. fills the latter and moreover partly or completely covers it. The form of the introduction, i.e. the filling with incomplete filling, can be dependent on the material of the structure, as described above.

Figure 15:
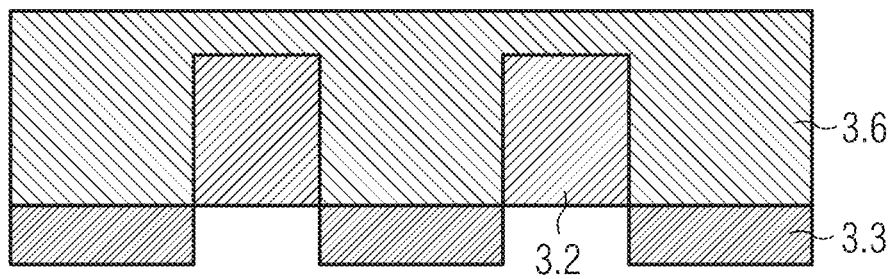
Figure 16:
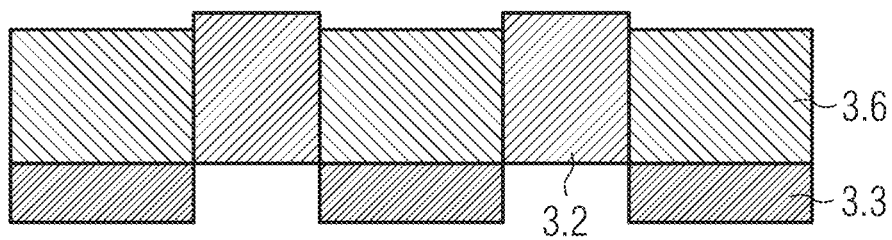
Figure 17:
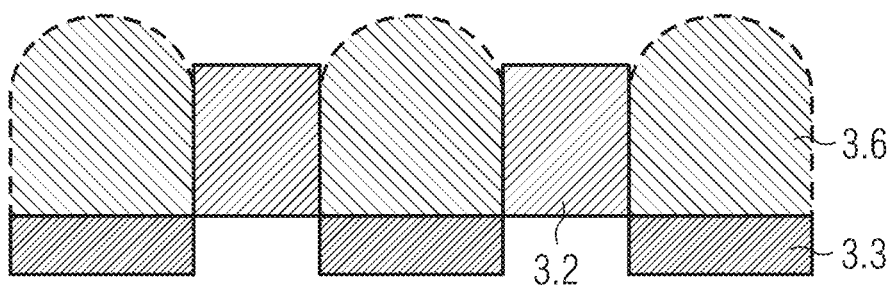
Figure 18:
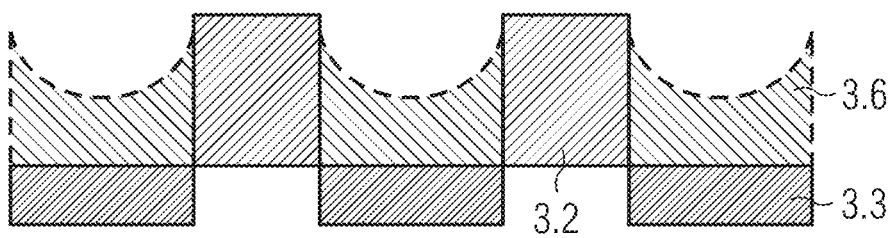

Various examples of such different fillings are shown in FIGS. 15 to 18. Shown here are electrode pixels 3.3 with the structure 3.2 as well as the first layer 3.6, which for example comprises a recrystallized first perovskite, as explained below. One variant is that the first layer 3.6 possesses a greater height than the structure 3.2, such as shown in FIG. 15, wherein another variant, which is shown in FIG. 16, has a lower height of the first layer 3.6 than the structure 3.2. In addition the first layer 3.6 can possess a positive curvature (FIG. 17), or a negative, as shown in FIG. 18. This depends for example on the wetting behavior (hydrophobic, hydrophilic) of the structure and/or of the first, pixelated electrode layer, for example of the electrode pixels.

In accordance with specific forms of embodiment the at least one first perovskite is at least partly recrystallized and in particular recrystallized in the first layer comprising at least one first perovskite. This enables the first layer to be bonded better to the structure.

The recrystallization here is not especially restricted. In particular the recrystallized first perovskite differs from a non-recrystallized first perovskite, since the crystal structure changes on recrystallization. Accordingly a corresponding first layer with at least partly or completely recrystallized perovskite (also called a recrystallized layer here) can easily be differentiated from another layer with the same perovskite, for example a second layer (also called an absorber layer here), in which the former is not recrystallized, because the layers have a different morphology, which is easily able to be detected with X-ray electron microscopy (REM) or transmission electron microscopy (TEM) with the aid of images. X-ray diffraction (XRD) spectra of the layers also exhibit differences.

A recrystallization can be undertaken in various different ways, for example by melting using methylamine gas, in particular with perovskites, which contain methylammonium ions, through pressure and/or temperature, wherein the methods can be adapted to the perovskite used. For example the first perovskite comprises alkyl ammonium ions, in particular with 1-4 C atoms, further preferably methylammonium ions, and the treatment for manufacturing a first layer is done with a gas comprising methylamine, in particular with methylamine gas.

The treatment of perovskites, which contain methylammonium ions, by means of methylamine (MA) gas has already been published in 2017 by Li et al. (Li, C., S. Pang, H. Xu and G. Cui. Methylamine gas based synthesis and healing process toward upscaling of perovskite solar cells: Progress and perspective. Solar RRL, 1(9), 1700076 (2017).). In their paper they describe the liquefaction of the previously solid perovskite layer after the action of MA gas and the subsequent recrystallization with a changed morphology, as soon as the MA gas is no longer contained in the atmosphere. The Patent EP 3304611 B1 also makes use of this phenomenon to produce perovskite from precursors (including a metal halide), which is applied to two different surfaces. In CN 10209088003 A a process is described in which a unicrystalline perovskite powder is applied to a mesoporous layer, such as for example titanium oxide, and liquefied by means of MA gas. As its liquid metaphase, the perovskite penetrates into the pores and recrystallizes there.

Treatment with MA gas is preferred in particular, since it is technically easy to handle and only small amounts of MA gas (e.g. in a vacuum chamber at a pressure of the MA gas of 10-6 mbar to 10 bar, e.g. in a chamber with a volume of 1 L (for example 0.25 g of MA gas at 200 mbar pressure)) are required, which saves costs.

The first layer can also be applied and recrystallized here in layers multiple times. The first layer comprising at least one first liquefied and recrystallized perovskite can serve in particular here as an adhesion promoter between the first, pixelated electrode layer or an optional other layer applied thereto such an electron conductor or hole conductor layer and where necessary a further, second or third layer, wherein the second or third layer serves here as a thick absorber layer, for example as a thick perovskite absorber layer in the event of second layer comprising at least one second perovskite. The structure thus serves indirectly here to enlarge the anchorage surface for the final bonding of the second and/or third layer, wherein the second and/or third layer usually adhere better to the first layer than to the first, pixelated electrode layer. Such binding in particular easily enables a critical absorber layer density to be produced, which is required in particular with X-ray and/or gamma detectors. A layer-to-layer structure is possible, wherein here a separate, second and/or third layer—which can be manufactured in a separate process, for example by rolling, sintering, etc., can then be applied for example with a greater layer thickness.

In accordance with specific forms of embodiment the first layer comprising at least one first perovskite fills at least the structure. This then enables there to be an improved bonding to further layers, for example a second or third layer or the second electrode, an optional electron-conducting or hole-conducting layer, etc.

In accordance with specific forms of embodiment an inventive detector for electromagnetic radiation further comprises a second layer comprising at least one second perovskite, which is located between the first layer comprising at least one first perovskite and the second electrode, and/or further comprising a third layer comprising at least one scintillator, which is located between the first layer comprising at least one first perovskite and the second electrode.

In accordance with specific forms of embodiment an inventive detector for electromagnetic radiation further comprises a second layer comprising at least one second perovskite, which is located between the first layer comprising at least one first perovskite and the second electrode.

The second layer comprising at least one second perovskite is not especially restricted. The amount of second perovskite in the second layer is also not especially restricted. In accordance with specific forms of embodiment the second layer comprises the at least one second perovskite in an amount of ≥30% w/w, ≥50% w/w, or ≥70% w/w, relative to the second layer, or essentially consists of the second perovskite (e.g. ≥90% w/w, ≥95% w/w, or ≥99% w/w, relative to the second layer); or even consists of the at least one second perovskite.

The second layer in particular represents an absorber layer for the electromagnetic radiation. In accordance with specific forms of embodiment it has a thickness (in the direction between the first, pixelated electrode layer and the second electrode) of 5 to 5000 µm, preferably 10 to 3000 µm, further preferably 50 to 2000 µm, even further preferably 100 to 1500 µm. The second layer can be manufactured as a separate layer, for example as a separately manufactured perovskite layer, and can be both freestanding and also non-freestanding, also for example during manufacturing be in contact with the second electrode or an optional electron-conducting or hole-conducting layer, e.g. in contact with an ITO or FTO electrode, wherein the second electrode can also be on a transparent surface layer such as a glass.

The composition of the second layer does not have to correspond to the composition of the first layer in respect of the connections, but can correspond to said layer. In particular the at least one first and the at least one second perovskite can be the same or different. In accordance with specific forms of embodiment the at least one first perovskite corresponds to the at least one second perovskite. This enables losses during detection, for example in respect of a readout signal or thermal stresses from the processing etc., to be avoided.

In accordance with specific forms of embodiment the second layer is in contact with the first layer and/or the structure and is in particular in contact with the first layer. The use of perovskites in both layers enables a good adhesion to be achieved.

In accordance with specific forms of embodiment an inventive detector for electromagnetic radiation further comprises a third layer comprising at least one scintillator, which is located between the first layer comprising at least one first perovskite and the second electrode.

The third layer is not especially restricted here. In accordance with specific forms of embodiment it has a thickness (in the direction between the first, pixelated electrode layer and the second electrode) of 5 to 5000 µm, preferably 10 to 3000 µm, further preferably 50 to 2000 µm, even further preferably 100 to 1500 µm. The third layer can be manufactured as a separate layer, for example as a separately manufactured scintillator layer, and can be both freestanding and also non-freestanding, thus for example can also be in contact during manufacturing with the second electrode or an optional electron-conducting or hole-conducting layer, e.g. in contact with an ITO or FTO electrode, wherein the second electrode can also be on a transparent surface layer such as a glass.

In accordance with specific forms of embodiment the third layer is in contact with the first layer and/or the structure and is in particular in contact with the first layer.

In forms of embodiment with first and third layer, the third layer serves in particular as a detector layer for high-energy radiation, for example X-ray and/or gamma radiation, and the first layer serves for indirect detection through the conversion of photons that are created in the third layer.

The scintillator of third layer is not especially restricted. For example CsI:Tl, cesium iodide doped with thallium, gadolinium oxysulfide doped with terbium, barium fluoride (BaF2), bismuth germanate (BGO), beryllium fluoride (BeF3), quantum dots, scintillating perovskite nanocrystals, etc., are suitable as scintillators.

In accordance with specific forms of embodiment the second layer comprises the at least one second perovskite, wherein the at least one second perovskite is at least partly not recrystallized. For the second layer no recrystallization is required since this can be manufactured in a simpler way, for example by sintering or rolling.

In accordance with specific forms of embodiment an inventive detector for electromagnetic radiation further comprises an electron-conducting and/or a hole-conducting layer, which is located between the first, pixelated electrode layer and the second electrode. A number of electron-conducting and/or hole-conducting layers can also be included in the detector.

The electron-conducting and/or hole-conducting layer is not especially restricted here, and just one electron-conducting layer, just one hole-conducting layer or an electron and a hole-conducting layer can be present in the inventive detector. An electron-conducting and/or hole-conducting layer represents an intermediate layer here, which is also referred to as an interlayer. An interlayer is accordingly an intermediate layer, which functions either as an electron transport (or hole-blocking (HBL)) layer, i.e. as an electron-conducting layer, or as a hole transport (or electron-blocking (EBL)) layer, i.e. as a hole-conducting layer.

The materials for such electron-conducting and/or hole-conducting layers are not especially restricted, and such materials can be used as are used in usual electron-conducting and/or hole-conducting layers.

An example of an electron-conducting layer (HBL) can for example comprise the following materials e.g. with ≥30% w/w, ≥50% w/w, or ≥70% w/w, relative to the electron-conducting layer; essentially consist of these (e.g. ≥90% w/w, ≥95% w/w, or ≥99% w/w, relative to the electron-conducting layer); or even consist of these (wherein the following list is not conclusive and moreover comprise mixtures and isomeric mixtures of the said materials, for example also binary, ternary, quaternary mixtures, etc.):

Fullerene derivatives such as C60 PCBM ([6,6]-phenyl C61 butanoic acid methylester), C70 PCBM ([6,6]-phenyl C71 butanoic acid methylester), bis-C60 PCBM (bis-[6,6]-phenyl C61 butanoic acid methylester), C60 oQDM (o-quinodimethane C60 monoaddukt), bis C60-OQDM (o-quinodimethane C60 bisaddukt), ICMA (indene C60 monoaddukt, ICBA (indene C60 bisaddukt), fullerole (C60 (OH)44); further acceptors, comprising polymers and small molecules, such as: dithienoindacene-based compounds such as 3,9-bis(2-methylene-(3-(1,1-dicyanomethylene)-indanone))-5,5,11,11-tetrakis(4-hexylphenyl)-dithieno[2,3-d:2',3'-d']-s-indaceno[1,2-b:5,6-b']dithiophene) (ITIC), IT-M (ITIC-M; 3,9-bis(2-methylene-((3-(1,1-dicyanomethylene)-6/7-methyl)-indanone))-5,5,11,11-tetrakis(4-hexylphenyl)-dithieno[2,3-d:2',3'-d']-s-indaceno[1,2-b:5,6-b']dithiophene), IT-DM (ITIC-DM; 3,9-bis(2-methylene-((3-(1,1-dicyanomethylene)-6,7-dimethyl)-indanone))-5,5,11,11-tetrakis(4-hexylphenyl)-dithieno[2,3-d:2',3'-d']-s-indaceno[1,2-b:5,6-b']dithiophene) and IDTBR ((5Z,5'Z)-5,5'-((7,7'-(4,4,9,9-Tetraoctyl-4,9-dihydro-s-indaceno[1,2-b:5,6-b']dithiophene-2,7-diyl)bis(benzo[c][1,2,5]thiadiazole-7,4-diyl))bis(methanylylidene))bis(3-ethylthiazolidine-2,4-dione)); perylenediimide-based compounds such as TPB (tert-butylprydine, C9H13N), SdiPDI—Se (perylenediimide derivate modified by the insertion of selenophene units into the bay position), NIDCS-HO ((2E,2'E)-3,3'-(2,5-bis(hexyloxy)-1,4-phenylene)bis(2-(5-(4-(N-(2-ethylhexyl)-1,8-naphthalimid)yl)-thiophene-2-yl)acrylonitril)); diketopyrrolopyrrole-based compounds such as DPP6 (dipeptidylaminopeptidase-like protein 6), 6,6'-(Benzo[c][1,2,5]thiadiazole-4,7-diylbis([2,2'-bithiophene]-5',5-diyl))bis(2,5-bis(2-ethylhexyl)-3-(thiophene-2-yl)-2,5-dihydropyrrolo[3,4-c]pyrrol-1,4-dione) (DTDfBT (DPP) 2), 6,6',6'',6'''-(9,9'-spirobi[fluorene]-2,2',7,7'-tetrayltetrakis(thiophene-5,2-diyl))tetrakis(2,5-bis(2-ethylhexyl)-3-(5-phenylthiophene-2-yl)-2,5-dihydropyrrolo[3,4-c]pyrrol-1,4-dione) (SF(DPPB)4); PFN (poly[(9,9-bis(3'-(N,N-dimethylamino)-propyl)-2,7-fluorene)-alt-2,7-(9,9-dioctylfluorene)]), PFN-OX (poly[9,9-bis(60-(N,N-diethylamino)propyl)-fluorene-alt-9,9-bis-(3-ethyl(oxetane-3-ethyloxy)-hexyl)-fluorene]), PFO (poly(9,9-di-n-octylfluorenyl-2,7-diyl)), PPDIDTT (poly{[N,N'-bis(2-decyl-tetradecyl)-3,4,9,10-perylenediimide-1,7-diyl]-alt-(dithieno[3,2-b:2', 3'-d]thiophene-2,6-diyl)}), TPBi (1,3,5-Tris(N-phenylbenzimidazole-2-yl)benzole); metal oxides such as TiOx, SnOx, etc.

An example of a hole-conducting layer (EBL) can for example comprise the following materials e.g. with ≥30% w/w, ≥50% w/w, or ≥70% w/w, relative to the electron-conducting layer; can essentially consist of these (e.g. ≥90% w/w, ≥95% w/w, or ≥99% w/w, relative to the electron-conducting layer); or can even consist of these (wherein the following list is not conclusive and moreover comprise mixtures of the said materials, for example also binary, ternary, quaternary mixtures, etc.):

Poly(3-hexylthiophene-2,5-diyl) (P3HT), poly[2-methoxy-5-(2-ethylhexyloxy)-1,4-phenylenvinylene] (MEH-PPV), poly[2-methoxy-5-(3',7'-dimethyloctyloxy)-1,4-phenylenevinylene] (MDMO-PPV), CN-PPV, CN-MEH-PPV, other phthalocyanines, poly[(9,9-di-n-octylfluorenyl-2,7-diyl)-alt-(benzo[2,1,3]thiadiazole-4,8-diyl)] (F8BT), polyfluorene (PF), poly[2,1,3-benzothiadiazole-4,7-diyl[4,4-bis(2-ethylhexyl)-4H-cyclopenta[2,1-b:3,4-b']dithiophene-2,6-diyl]] (PCPDTBT), Squaraines (e.g. symmetrical squaraine with e.g. final-state hydrazone with glycolic functionalization or diazulene-squaraine), PTT (polythieno[3,4-b]thiophene), poly(5,7-bis(4-decanyl-2-thienyl)-thieno(3,4-b)diathiazole-thiophene-2,5) (PDDTT); diketopyrrolopyrrol-based polymers such as poly{2,2'-[(2,5-bis(2-hexyldecyl)-3,6-dioxo-2,3,5,6-tetrahydropyrrolo[3,4-c]pyrrol-1,4-diyl)dithiophene]-5,5'-diyl-alt-thiophene-2,5-diyl} (PDPP3T), poly[[2,5-bis(2-hexyldecyl-2,3,5,6-tetrahydro-3,6-dioxopyrrolo[3,4 c]pyrrol-1,4-diyl]-alt-[3',3'''-dimethyl-2,2':5',2'''-terthiophene]-5,5''-diyl] (PMDPP3T), poly{2,2'-[(2,5-bis(2-hexyldecyl)-3,6-dioxo-2,3,5,6-tetrahydropyrrolo[3,4-c]pyrrol-1,4-diyl)dithiophene]-5,5'-diyl-alt-terthiophene-2,5-diyl} (PDPP5T), poly[2,6-4,8-di (5-ethylhexylthienyl)benzo[1,2-b;3,4-b]dithiophene-alt-5-dibutyloctyl-3,6-bis(5-bromthiophene-2-yl) pyrrolo[3,4-c]pyrrole-1,4-dione] (PBDTT-DPP); dithienosilole-based polymers such as poly[(4,4-bis(2-ethylhexyl) dithieno[3,2-b:2',3'-d]silole)-2,6-diyl-alt-(4,7-bis(2-thienyl)-2,1,3-benzothiadiazole)-5,5'-diyl] (PSBTBT), 7,7'-(4,4-bis(2-ethylhexyl)-4H-silol[3,2-b:4,5-b']dithiophene-2,6-diyl)bis(6-fluoro-4-(5'-hexyl-[2,2'-bithiophene]-5-yl) benzo[c][1,2,5]thiadiazole) (p-DTS(FBTTh2)2), poly[2,7-

(9,9-dioctyl-dibenzosilol)-alt-4,7-bis(thiophene-2-yl)benzo-2,1,3-thiadiazole] (PSiFDTBT); benzodithiophene-based polymers such as poly[4,8-bis[(2-ethylhexyl)oxy]benzo[1,2-b:4,5-b']dithiophene-2,6-diyl-alt-3-fluoro-2-[(2-ethylhexyl)carbonyl]thieno[3,4-b]thiophene-4,6-diyl] (PTB7), poly[(2,6-(4,8-bis(5-(2-ethylhexyl)thiophene-2-yl)-benzo[1,2-b:4,5-b']dithiophene))-alt-(5,5-(1',3'-di-2-thienyl-5',7'-bis(2-ethylhexyl)benzo[1',2'-c:4',5'-c']dithiophene-4,8-dione))]) (PBDB-T), poly{2,6'-4,8-di(5-ethylhexylthienyl)benzo[1,2-b;3,4-b]dithiophene-alt-5-dibutyloctyl-3,6-bis(5-bromothiophene-2-yl)pyrrolo[3,4-c]pyrrol-1,4-dione (PBDTT-DPP), poly[4,8-bis(5-(2-ethylhexyl)thiophene-2-yl)benzo[1,2-b;4,5-b']dithiophene-2,6-diyl-alt-(4-(2-ethylhexyl)-3-fluorothieno[3,4-b]thiophene-)-2-carboxylat-2-6-diyl)] (PBDTT-FTTE), poly[(4,8-bis-(2-ethylhexyloxy)-benzo(1,2-b:4,5-b')dithiophene)-2,6-diyl-alt-(4-(2-ethylhexanoyl)-thieno[3,4-b]thiophene-)-2-6-diyl)] (PBDTTT-C-F), polybenzothiadiazole (thiophene)-stat-benzodithiophene (thiophene)-8 (PBTZT-stat-BDTT-8) and other polymers and copolymers and small molecules with an absorption maximum between 320-800 nm; polytriarylamine and derivates, poly[[2,5-bis(2-octyldo-decyl)-2,3,5,6-tetrahydro-3,6-dioxopyrrolo[3,4-c]pyrrol-1,4-diyl]-alt2[[2,2'-(2,5-thiophene)bisthieno[3,2-b]thiophene]-5,5'-diyl]] (DPP(P)), polyaniline (PANI), poly[(4,8-bis-(2-ethylhexyloxy)-benzo(1,2-b:4,5-b')dithiophene)-2,6-diyl-alt-(4-(2-ethylhexanoyl)-thieno[3,4-b]thiophene)-2-6-diyl)] (PBDTTT-C), poly[N29-hepta-decanyl-2,7-carbazole-alt-3,6-bis-(thiophene-5-yl)-2,5-dioctyl-2,5-dihydropyrrolo[3,4-]pyrrol-1,4-dione] (PCBTDPP), poly[[9-(1-octylnonyl)-9H-carbazole-2,7-diyl]-2,5-thiophendiyl-2,1,3-benzothiadiazole-4,7-diyl-2,5-thiophendiyl] (PCDTBT), poly[2,5-bis(2-octyldodecyl)pyrrolo[3,4-c]pyrrole-1,4(2H,5H)-dione-(E)-1,2-di(2,2'-bithiophene-5-yl)ethene] (PDPPDBTE), perfluoro(4-methyl-3,6-dioxoact-7-en)sulfonylfluoride (PFI), poly(4-styrolsulfonate)-graft-polyaniline (PSS-g-PANI), copolymers from 2'-butyloctyl-4,6-dibromo-3-fluorothieno[3,4-b]thiophene-2-carboxylate (TT-BO), copolymers from 3',4'-dichlorobenzyl-4,6-dibromo-3-fluorothieno-[3,4-b]thiophene-2-carboxylate (TT-DCB) and 2,6-bis(trimethyl-tin)-4,8-bis(2-ethylhexyloxy)benzo[1,2-b:4,5-b']dithiophene (BDT-EH) (PTB-DCB21); N2,N2,N2',N2',N7,N7,N7',N7'-octakis(4-methoxyphenyl)-9,9'-spirobi[9H-fluorene]-2,2',7,7'-tetramine (spiro-OMeTAD), poly[(9,9-dioctylfluorenyl-2,7-diyl)-co-(4,4'-(N-(4-sec-butylphenyl) diphenylamine)] (TFB), N4,N4'-di(naphthalene-1-yl)-N4,N4'-bis(4-vinylphenyl)biphenyl-4,4'-diamine (VNPB), 1,4-bis(4-sulfonatobutoxy)benzole and thiophene component (PhNa-1T)); metal oxides such as NiOx, MoOx, etc.

An electron-conducting and/or a hole-conducting layer can be provided for example between the first, pixelated electrode layer and the first layer, between the first layer and the optional second and/or third layer, wherein this is less preferable, between an optional second and an optional third layer (less preferable) and/or between the optional second layer and the second electrode.

In accordance with specific forms of embodiment an inventive detector for electromagnetic radiation further comprises a substrate, on which the first, pixelated electrode layer is located, wherein the substrate preferably has a plurality of transistors, wherein further preferably at least one transistor in each case contacts an electrode pixel of the first, pixelated electrode layer.

The substrate is not especially restricted and can be a pixelated substrate for example. The substrate serves in particular for contacting the electrode pixels and/or for stabilizing the detector, but also simplifies its manufacture. The substrate can be that which normally occurs in detectors, in particular X-ray and/or gamma detectors.

The transistors are also not especially restricted and can be TFTs for example. A number of transistors can also contact an electrode pixel.

In accordance with specific forms of embodiment a surface layer, for example a glass and/or an encapsulation, can be located on the second electrode as well.

An inventive detector of an embodiment is in particular embodied planar. For an embodiment of the inventive detector simple solutions such as the use of Anisotropic Conductive Films (ACF) or Conductive Inks are in particular not able to be employed, because a "planar" contacting per electrode pixel to the first layer must be guaranteed, and not a point contact. Planar here in accordance with specific forms of embodiment means a contacting of the surface of the first layer per electrode pixel that is greater than 60% of the surface of the electrode pixel, preferably >80%, further preferably >90%, e.g. more than 95%, more than 99%, or even 100%.

Figure 1:
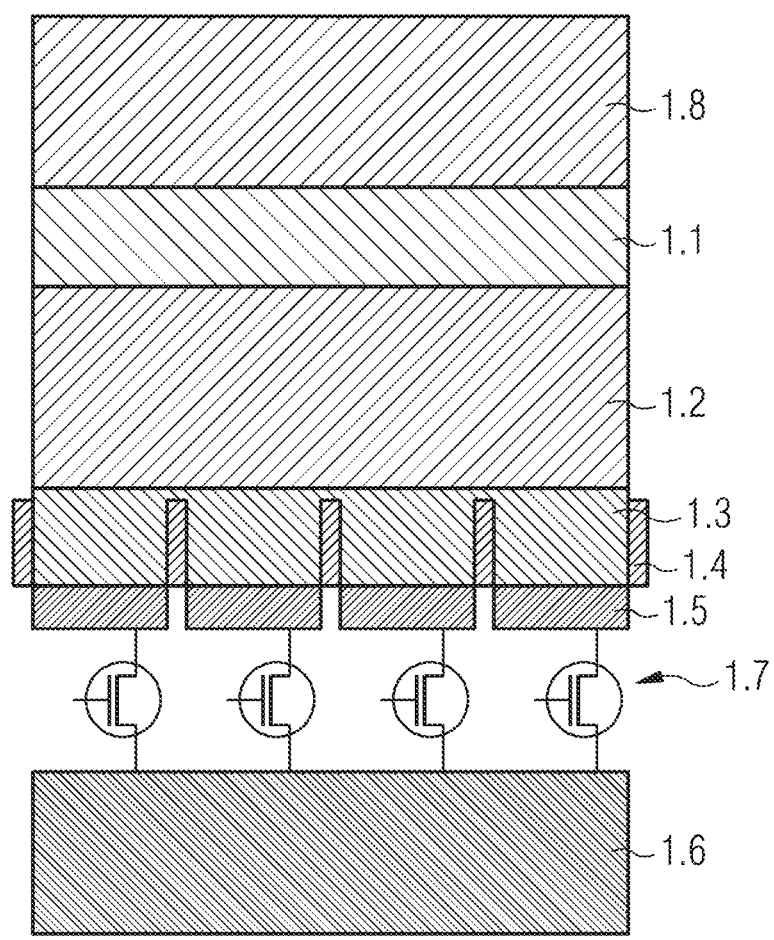
FIG. 1 shows a schematic of an example of an embodiment of an inventive X-ray detector.

An example embodiment of an inventive detector is shown schematically in FIG. 1, wherein an example of a layer arrangement is shown in this figure, here for example of an X-ray and/or gamma detector. The substrate 1.6 comprises transistors 1.7, for example thin film transistors (TFTs) in an active matrix driving scheme. The transistors 1.7 make contact with the electrode pixels 1.5, which form a structured first, pixelated electrode layer. Between the electrode pixels 1.5 are intermediate spaces, above which a structure 1.4 is located, here for example as a grid for an anchor structure. In the structure 1.4 and beyond this is located a first layer 1.3 comprising at least one first perovskite, which is recrystallized. A second layer 1.2 comprising at least one second perovskite is located on the first layer 1.3, which corresponds here to at least one first perovskite. Above this is located the second electrode 1.1 as well as an encapsulation 1.8.

As a supplement to the layer structure of the detector shown in FIG. 1 by way of example one or more interlayers, i.e. electron-conducting and/or hole-conducting layers with electron-conducting and/or hole-conducting (hole/electron-blocking) functions are located in the structure. Possible positions for one or more interlayers would for example be between the electrode pixels 1.5 and the first layer 1.3, between the first layer 1.3 and the second layer 1.2, wherein this is less preferable, and/or between the second layer 1.2 and the second electrode 1.1.

Further disclosed is a method for manufacturing a detector for electromagnetic radiation, in particular an X-ray and/or gamma detector, comprising:

Provision of a first, pixelated electrode layer comprising a plurality of electrode pixels as well as intermediate spaces between the individual electrode pixels;

Application of a structure at least partly to the intermediate spaces of the first, pixelated electrode layer, wherein the structure is applied in such a way that the structure is arranged at least partly on the intermediate spaces between the individual electrode pixels away from the first electrode layer;

Introduction of a first layer comprising at least one first perovskite into the structure; and Application of a second electrode to the structure and/or the first layer comprising at least one first perovskite; or Provision of a structure, wherein the structure has intermediate spaces;

Introduction of a plurality of electrode pixels between the intermediate spaces of the structure, wherein the electrode pixels do not fill the structure, and thereby form a first, pixelated electrode layer;

Introduction of a first layer comprising at least one first perovskite into the structure; and Application of a second electrode to the structure and/or the first layer comprising at least one first perovskite.

In accordance with specific forms of embodiment the steps are carried out in the specified order.

An embodiment of the inventive method in particular enables an embodiment of the inventive detector to be manufactured. Accordingly descriptions of embodiments of the inventive detector in accordance with specific forms of embodiment also relate to embodiments of the inventive method as well as vice versa. In particular the different layers and materials for its manufacture can be the same in the inventive method as those that have already been described in conjunction with the inventive detector, as well as also vice versa. The advantage of the inventive method is that it is easily scalable to large surfaces (e.g. 43×43 cm2).

An embodiment of an inventive method can initially comprise the steps

I) Provision of a first, pixelated electrode layer comprising a plurality of electrode pixels as well as intermediate spaces between the individual electrode pixels;

Application of a structure at least partly to the intermediate spaces of the first, pixelated electrode layer, wherein the structure is applied in such a way that the structure is arranged at least partly on the intermediate spaces between the individual electrode pixels away from the first electrode layer;

or the steps

II) Provision of a structure, wherein the structure has intermediate spaces;

Introduction of a plurality of electrode pixels between the intermediate spaces of the structure, wherein the electrode pixels do not fill the structure, and thereby form a first, pixelated electrode layer.

The embodiments of the two methods can be differentiated for example in respect of the manufacturing of the structure. Variant I) is for example advantageous for methods in which the structure is applied retrospectively, such as for example with resists, in particular photoresists, or with 3D printing. Variant II) is the best approach on the other hand for methods in which parts of a substrate, etc. are removed in order to manufacture a structure, such as for example with etching or laser ablation, as described above.

Neither the provision of a first, pixelated electrode layer, which can be done as described above, nor the provision of a structure in variant II), which can likewise be done as described above, for example based on a substrate, are especially restricted. The application of a structure in variant I) can be undertaken as described above for example by application of resist, for example photoresist, where necessary also a number of times, and/or by 3D printing etc. The introduction of the electrode pixels in variant II can be undertaken for example by introduction of the material of the electrode pixels, as described above, into the region between the "intermediate spaces" of the first, pixelated electrode layer (which are defined thereby in these forms of embodiment as described above), for example also on contactings of a substrate, and liquefaction and solidification again (for example melting and hardening again), introduction of the solid electrode pixels, solidification from the gas phase, vapor deposition from a solution, etc., and is not especially restricted, and can also be undertaken from precursors of the electrode material, for example with a precipitation.

In both methods the first layer comprising at least one first perovskite is then introduced. This step too is not especially restricted. For example the material for the first layer comprising at least one first perovskite, for example at least one first perovskite material and/or its precursors, can be introduced as powder into the structure and liquefied and hardened again there. The introduced material composition thus does not have to correspond to the final composition of the final first layer. If precursors are introduced, after manufacturing of the at least one first perovskite, this is likewise liquefied and hardened again in order to recrystallize it. Here the at least one first perovskite or the first layer can bond well with the structure and be attached thereto, since a good wetting can take place through the liquid phase. The liquefaction here is not especially restricted and, as already described above in conjunction with the detector, can be undertaken by the action of methalamine gas (MA gas), pressure and/or temperature. The hardening and thus recrystallization can then accordingly be undertaken again by removal of the MA gas and/or a further corresponding temperature and/or pressure change, wherein these can be adapted to the at least one first perovskite.

A corresponding method is shown schematically in FIGS. 12 to 14. A first electrode layer 3.3 comprising electrode pixels is located on a substrate 3.4, as shown in FIG. 12. Above the intermediate spaces of the first electrode layer 3.3 is located a structure 3.2 as anchor structure. The material for the first layer is introduced into the structure 3.2 as powder 3.1, for example as perovskite powder or as precursor materials for perovskite, and where necessary is also applied, as shown here by way of example in FIG. 12. In the step shown in FIG. 13 the powder is subsequently liquefied by the action of MA gas, temperature T, etc., so that a liquid first layer 3.5 forms. Then, in the step shown in FIG. 14, this is recrystallized, in order to form a recrystallized first layer 3.6. This then has a good adhesion to the first electrode layer 3.3 with a good electrical contacting of the individual electrode pixels to its surface, e.g. greater than 60% of the surface of the electrode pixels, preferably >80%, further preferably >90%, e.g. more than 95%, more than 99%, or even 100%.

In such a method the application of the materials for the first layer, for example of the at least one first perovskite and/or its precursors, the liquefaction and the recrystallization can be applied once or a number of times in order to obtain a desired fill height or thickness of the first layer.

As an alternative just a part of the first layer can be liquefied, e.g. by means of MA gas, temperature and/or pressure, and this liquefied part can be brought in contact with the structure and preferably finally with the first, pixelated electrode, after which the liquefied part of the first layer is then recrystallized. A structure is formed here after the recrystallization, which has a combination of a first layer and a second layer with the same perovskite molecule in a different crystal structure, as described above, so that then corresponding layer thicknesses are also produced, for example overall of 5 to 5000 µm, preferably 10 to 3000 µm, further preferably 50 to 2000 µm, even further preferably 100 to 1500 µm, as well as where necessary in addition the height of the structure, which can be as specified above. Thus the absorber layer is partly liquefied here and bonded directly to the anchor structure.

A corresponding method is shown schematically in FIGS. 23 to 25. The first, pixelated electrode layer 5.3 is located on the substrate 5.4, as shown in FIG. 23, and the structure 5.2 is located above it above the intermediate spaces between the electrode pixels. The first layer 5.1 is partly liquefied by MA gas, temperature, etc., so that a liquefied part 5.7 forms. As shown in FIG. 24, this liquefied part 5.7 is then contacted with the structure 5.2 and the first, pixelated electrode layer 5.3 or is positioned on said elements. Thereafter the liquefied part 5.7 is hardened and, as shown in FIG. 25, a recrystallized part 5.9 of the first layer 5.1 is formed.

Mixed forms and derived versions of both methods are also possible, if in addition for example a second layer comprising at least one second perovskite and/or a third layer comprising at least one scintillator are additionally applied, so that a detector with a thick absorber layer is produced, the adhesion of which to the first, pixelated electrode layer by the first layer is improved.

An example of a derived version is shown in FIGS. 19 to 22. Here, as shown in FIG. 19, a second layer 5.6 comprising at least one second perovskite, which can be the same as or different from at least one first perovskite, is provided as a thick absorber layer, e.g. with a thickness of 10-3000 µm, preferably 50-2000 µm, more preferably 100-1500 µm, wherein these can be manufactured in a separate process, e.g. by sintering, rolling or high-temperature processes, so that here a decoupling of processes for manufacturing the detector layer is possible.

Figure 22:
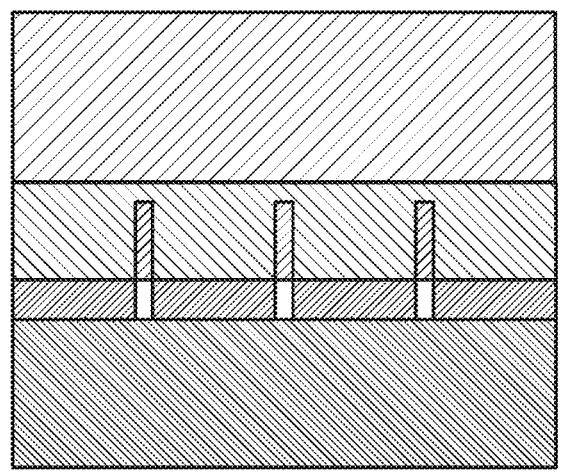

Moreover a substrate 5.4 with first, pixelated electrode layer 5.3 and structure 5.2, here for example as a grid structure, are provided, wherein the first layer 5.1 is located in the structure 5.2 and above it, which here for example can have a liquid or already a recrystallized first perovskite. In the step shown in FIG. 20 a part of the first layer 5.1 is liquefied again by MA gas and/or (also optionally with) pressure (e.g. 1-300 MPa, preferably 2-100 MPa, more preferably 3-50 MPa depending on material, in particular perovskite) and/or temperature (e.g. 0-600° C., depending on material, in particular perovskite), etc., so that a liquefied layer 5.7 forms. The specified pressures and temperatures are also able to be employed in the corresponding other methods. The second layer is applied to or positioned on the liquefied layer 5.7, as shown in FIG. 21, wherein it adheres well to the liquefied layer 5.7. After hardening of the liquefied layer 5.7 the first layer 5.1 forms again with recrystallized perovskite, as shown in FIG. 22. The second layer 5.6 is further fixed by this.

A "mixed method" is shown in FIGS. 26 to 28, wherein this represents a type of mixing of the methods of FIGS. 19 to 22 and 23 to 25.

As shown in FIG. 26, a second layer 5.6 with a liquefied part 5.8 is provided as in FIG. 23, wherein the liquefied part can be manufactured by MA gas, temperature, etc. Moreover, on the substrate 5.4 with first, pixelated electrode layer 5.3 and structure 5.2, a first layer 5.1 is partly liquefied, in order to provide a liquefied layer 5.7 (corresponding to FIG. 19), likewise by means of MA gas, temperature, etc. The liquefied layer 5.7 is contacted with the liquefied part 5.8, as shown in FIG. 27. After the recrystallization a mixed bonded structure is formed, as shown in FIG. 28. Thus both a part of the second layer, which here represents the predominantly absorber layer, and also a part of the first layer, which serves to promote adhesion, is liquefied, and both are brought into contact, in order to fix the layers accordingly to the first, pixelated electrode layer.

Further mixed forms and variants, which are not explicitly described in conjunction with the Figures, but which lead to the same detector however, in which thus a first perovskite, in particular at least one first recrystallized perovskite, in a first layer is completely or partly in direct contact with the structure, i.e. for example methods with other fill levels in the structure, etc., are included in embodiments of the inventive method.

Subsequent to the application of the first and where necessary second and/or third layer, the second electrode is applied, wherein this is likewise not especially restricted. The second electrode being applied beforehand to a non-liquefied part of the first layer, as specified in the above variant with the liquefied part, to the second or to the third layer is also not excluded.

In accordance with specific forms of embodiment the introduction of the first layer comprising at least one first perovskite comprises an at least part recrystallization of the at least one first perovskite. Through this the adhesion of the first layer is improved, as explained above.

In accordance with specific forms of embodiment at least the structure is filled with the first layer comprising at least one first perovskite. Through this the bonding of further layers is improved, as explained above.

In accordance with specific forms of embodiment a second layer comprising at least one second perovskite and/or a third layer comprising at least one scintillator are applied to the first layer comprising at least one first perovskite. The materials of the layers correspond to those that have already been described in conjunction with the detector.

In accordance with specific forms of embodiment the second layer comprising at least one second perovskite is applied, wherein the at least one second perovskite is at least partly not recrystallized. A decoupling from the manufacturing of the second layer, which primarily serves as an absorber layer (e.g. by sintering, rolling or high-temperature processes etc.) and the application to the further detector (e.g. embodied as a backplane), is made possible.

In accordance with specific forms of embodiment an electron-conducting and/or a hole-conducting layer is further introduced between the first, pixelated electrode layer and the second electrode. These can be applied at a suitable point during the method, i.e. to the first, pixelated electrode layer, the first layer, the second and/or third layer, etc., as explained above in conjunction with the detector. The materials of the layers correspond to those that have already been described in conjunction with the detector.

In accordance with specific forms of embodiment the first, pixelated electrode is applied to a substrate. This is not especially restricted and can be embodied as above in conjunction with the detector.

In accordance with specific forms of embodiment the substrate has a plurality of transistors, wherein preferably the first, pixelated electrode layer is applied in such a way that at least one transistor in each case contacts an electrode pixel of the first, pixelated electrode layer.

Likewise disclosed is the use of a structure to increase the adhesion between a pixelated electrode layer comprising a plurality of electrode pixels and a layer, in particular a detector layer, comprising at least one first perovskite, wherein the pixelated electrode layer and the layer comprising at least one first perovskite are both in contact with the structure, and in particular its use in a detector, in particular in an X-ray and/or gamma detector.

The above forms of design, embodiments and developments, where sensible, can be combined with one another in any given way. Further possible embodiments, developments and implementations of the invention also comprise combinations not explicitly stated of features of the invention described above or below in relation to the exemplary embodiments. In particular the person skilled in the art will also add individual aspects as improvements or enhancements to the respective basic form of the present invention.

Embodiments of the invention is consequently further explained in detail in relation to different examples. Embodiments of the invention are not restricted to these examples however.

On a first electrode layer with electrode pixels consisting of for example ITO or Pt a structure made of SU-8 as photoresist is formed between the electrode pixels according to FIG. 3. According to FIGS. 12 to 14 MAPI ($CH_3NH_3PbI_3$) as first perovskite is introduced into the structure in powder form, liquefied with MA gas and recrystallized. According to FIGS. 19 to 22 a second layer made of MAPI, which has been manufactured as an absorber layer by means of sintering is applied, wherein the first layer is liquefied again and after being brought into contact with the second layer is recrystallized, and a second electrode made of Cr or Ti is applied thereto. Compared with a layout without structure, an improved adhesion is produced.

As can be seen from the XRD spectra shown in FIG. 29, in which the angle $2\theta$ in ° is plotted against the intensity I in count c, the MAPI 12 of the first layer treated with MA gas, by comparison with non-treated MAPI 11 of the second layer, has eight further peaks 1 to 8, from which the structure change of the crystals of the MAPI in of the first layer arises.

Since in the example of the first layer the same material has been used as in the second layer, when used in an X-ray detector, no losses are produced in the readout signal and also no thermal stresses by the processing.

The patent claims of the application are formulation proposals without prejudice for obtaining more extensive patent protection. The applicant reserves the right to claim even further combinations of features previously disclosed only in the description and/or drawings.

References back that are used in dependent claims indicate the further embodiment of the subject matter of the main claim by way of the features of the respective dependent claim; they should not be understood as dispensing with obtaining independent protection of the subject matter for the combinations of features in the referred-back dependent claims. Furthermore, with regard to interpreting the claims, where a feature is concretized in more specific detail in a subordinate claim, it should be assumed that such a restriction is not present in the respective preceding claims.

Since the subject matter of the dependent claims in relation to the prior art on the priority date may form separate and independent inventions, the applicant reserves the right to make them the subject matter of independent claims or divisional declarations. They may furthermore also contain independent inventions which have a configuration that is independent of the subject matters of the preceding dependent claims.

None of the elements recited in the claims are intended to be a means-plus-function element within the meaning of 35 U.S.C. § 112(f) unless an element is expressly recited using the phrase "means for" or, in the case of a method claim, using the phrases "operation for" or "step for."

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A detector for electromagnetic radiation, comprising:
   a pixelated electrode layer including a plurality of electrode pixels, the plurality of electrode pixels forming intermediate spaces between respective electrode pixels among the plurality of electrode pixels;
   a second electrode;
   a first layer between the pixelated electrode layer and the second electrode, the first layer including at least one first perovskite; and
   a structure at least partly between the pixelated electrode layer and the second electrode, the structure being at least partly between the plurality of electrode pixels, the structure being at least partly in the intermediate spaces with respect to a direction, the direction being toward the second electrode and away from the pixelated electrode layer, and the first layer filling and covering the structure.

2. The detector for electromagnetic radiation of claim 1, wherein the at least one first perovskite is at least partly recrystallized.

3. The detector for electromagnetic radiation of claim 2, further comprising at least one of:
   a second layer between the first layer and the second electrode, the second layer including at least one second perovskite; or
   a third layer between the first layer and the second electrode, the third layer including at least one scintillator.

4. The detector for electromagnetic radiation of claim 3, wherein
   the detector further comprises the second layer; and
   the at least one second perovskite is at least partly not recrystallized.

5. The detector for electromagnetic radiation of claim 2, further comprising:
   at least one of an electron-conducting layer or a hole-conducting layer between the pixelated electrode layer and the second electrode.

6. The detector for electromagnetic radiation of claim 2, further comprising:
   a substrate including a plurality of transistors, the pixelated electrode layer being on the substrate, each respective transistor among the plurality of transistors contacting a corresponding electrode pixel among the plurality of electrode pixels.

7. The detector for electromagnetic radiation of claim 1, further comprising at least one of:
   a second layer between the first layer and the second electrode, the second layer including at least one second perovskite; or
   a third layer between the first layer and the second electrode, the third layer including at least one scintillator.

8. The detector for electromagnetic radiation of claim 7, wherein
   the detector comprises the second layer; and
   the at least one second perovskite is at least partly not recrystallized.

9. The detector for electromagnetic radiation of claim 1, further comprising:
   at least one of an electron-conducting layer or a hole-conducting layer between the pixelated electrode layer and the second electrode.

10. The detector for electromagnetic radiation of claim 1, further comprising:

a substrate including a plurality of transistors, the pixelated electrode layer being on the substrate, each respective transistor among the plurality of transistors contacting a corresponding electrode pixel among the plurality of electrode pixels.

11. The detector for electromagnetic radiation, of claim 1, wherein the detector is at least one of an X-ray detector or a gamma detector.

12. The detector for electromagnetic radiation of claim 1, wherein the structure extends in the direction for 0.5 to 1500 µm.

13. A method for manufacturing a detector for electromagnetic radiation, comprising:
    manufacturing the detector according to a first process or a second process, the first process including,
        provisioning a pixelated electrode layer including a plurality of electrode pixels, the plurality of electrode pixels forming intermediate spaces between respective electrode pixels among the plurality of electrode pixels,
        applying a structure in a direction away from the pixelated electrode layer such that the structure is arranged at least partly in the intermediate spaces,
        first introducing a first layer into the structure, the first layer including at least one first perovskite, and the first layer filling and covering the structure, and
        applying a second electrode to the first layer, and
    the second process including,
        provisioning the structure, the structure forming intermediate spaces,
        introducing the plurality of electrode pixels between the intermediate spaces of the structure, the plurality of electrode pixels not filling the structure, and the plurality of electrode pixels forming the pixelated electrode layer,
        second introducing the first layer into the structure, the first layer including the at least one first perovskite, and the first layer filling and covering the structure, and
        applying a second electrode to the first layer.

14. The method of claim 13, wherein the first introducing of the first layer and the second introducing of the first layer both include an at least partial recrystallization of the at least one first perovskite.

15. The method of claim 14, wherein the manufacturing of the detector further comprises:
    applying at least one of a second layer or a third layer to the first layer, the second layer including at least one second perovskite, and the third layer including at least one scintillator.

16. The method of claim 15, wherein
    the applying the at least one of the second layer or the third layer includes applying the second layer; and
    the at least one second perovskite is at least partly not recrystallized.

17. The method of claim 13, wherein the manufacturing of the detector further comprises:
    applying at least one of a second layer or a third layer to the first layer, the second layer including at least one second perovskite, and the third layer including at least one scintillator.

18. The method of claim 17, wherein
    the applying the at least one of the second layer or the third layer includes applying the second layer; and
    the at least one second perovskite is at least partly not recrystallized.

19. The method of claim 13, wherein the manufacturing of the detector further comprises:
    introducing at least one of an electron-conducting layer or a hole-conducting layer between the pixelated electrode layer and the second electrode.

20. The method of claim 13, wherein the manufacturing of the detector further comprises:
    applying the pixelated electrode layer to a substrate.

21. The method of claim 20, wherein
    the substrate includes a plurality of transistors; and
    the applying the pixelated electrode layer to the substrate includes applying the pixelated electrode layer to the substrate such that each respective transistor among the plurality of transistors contacts a corresponding electrode pixel among the plurality of electrode pixels.

22. The method of claim 13, wherein the applying the structure and the provisioning the structure both comprise applying a resist.

* * * * *